(12) United States Patent
Shiraishi et al.

(10) Patent No.: US 6,538,740 B1
(45) Date of Patent: Mar. 25, 2003

(54) ADJUSTING METHOD FOR POSITION DETECTING APPARATUS

(75) Inventors: Naomasa Shiraishi, Urawa (JP); Nobutaka Magome, Oosato-gun (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/635,339

(22) Filed: Aug. 9, 2000

Related U.S. Application Data

(63) Continuation of application No. PCT/JP99/00551, filed on Feb. 9, 1999.

(30) Foreign Application Priority Data

| Mar. 31, 1998 | (JP) | 10-085858 |
|---|---|---|
| Feb. 16, 1998 | (JP) | 10-032788 |
| Feb. 9, 1998 | (JP) | 10-027474 |

(51) Int. Cl.$^7$ .............................................. G01B 11/00
(52) U.S. Cl. ...................... 356/401; 356/636; 250/548; 430/30
(58) Field of Search ................................. 356/401, 399, 356/400, 636; 250/548; 430/22, 5

(56) References Cited

U.S. PATENT DOCUMENTS

| 5,243,195 A | 9/1993 | Nishi | 250/548 |
|---|---|---|---|
| 5,493,403 A | 2/1996 | Nishi | 356/401 |
| 5,615,006 A | 3/1997 | Hirukawa et al. | 356/124 |

(List continued on next page.)

FOREIGN PATENT DOCUMENTS

| EP | 0 701 174 A1 | 3/1996 |
|---|---|---|
| JP | A-4-65603 | 3/1992 |
| JP | A-4-273246 | 9/1992 |
| JP | A-4-324923 | 11/1992 |
| JP | A-4-364020 | 12/1992 |
| JP | A-5-41343 | 2/1993 |
| JP | A-6-117831 | 4/1994 |
| JP | A-7-288276 | 10/1995 |
| JP | A-7-321030 | 12/1995 |
| JP | A-7-326563 | 12/1995 |
| JP | A-8-64500 | 3/1996 |
| JP | A-8-94315 | 4/1996 |
| JP | A-8-195336 | 7/1996 |
| JP | A-8-213306 | 8/1996 |
| JP | A-8-306609 | 11/1996 |
| JP | A-8-327318 | 12/1996 |
| JP | A-10-27474 | 1/1998 |
| JP | A-10-32788 | 2/1998 |
| JP | A-10-85858 | 4/1998 |

OTHER PUBLICATIONS

T. Kanda et al., "Alignment Sensor Corrections for Tool Induced Shift (TIS)," Proc. SPIE, vol. 3051, pp. 846–855 (1997).
Specification of U.S. patent application No. 391,648.
International Search Report.

Primary Examiner—Frank G. Font
Assistant Examiner—Layla Lauchman
(74) Attorney, Agent, or Firm—Oliff & Berridge, PLC

(57) ABSTRACT

An adjusting method capable of accurately forming a mark for measuring optical characteristics of an optical system, such as an alignment sensor of an exposure system to be used in manufacturing semiconductor devices or the like and correcting an aberration or the like of the optical system with a high precision. A first mark (DM1) having a recess pattern (31a) with a width a provided at a pitch P in a measuring direction and a second mark (DM2) having a recess pattern (32a) with a width c provided at a pitch P have been formed in the vicinity of each other on a wafer (11) for adjustment, and the duty ratio (=a/P) of the recess pattern (31a) of the first mark and the duty ratio (=c/P) of the recess pattern (32a) of the second mark are different. The distance of the images of the two marks (DM1, DM2) is measured, an error in this measured value with respect to a designed value is determined, and the detecting optical system is adjusted in such a way as to reduce this error.

36 Claims, 14 Drawing Sheets

U.S. PATENT DOCUMENTS

| | | | |
|---|---|---|---|
| 5,680,200 A | 10/1997 | Sugaya et al. | 355/53 |
| 5,706,091 A | 1/1998 | Shiraishi | 356/399 |
| 5,721,605 A | 2/1998 | Mizutani | 355/53 |
| 5,754,299 A | 5/1998 | Sugaya et al. | 356/401 |
| 5,783,833 A | 7/1998 | Sugaya et al. | 250/548 |
| 5,788,229 A | 8/1998 | Asami et al. | 271/305 |
| 5,798,838 A * | 8/1998 | Taniguchi et al. | 356/401 |
| 6,057,908 A * | 5/2000 | Ota | 355/55 |
| RE36,799 E * | 8/2000 | Nishi | 250/548 |
| 6,097,473 A * | 8/2000 | Ota et al. | 355/53 |
| 6,100,987 A * | 8/2000 | Kawakubo | 356/401 |
| 6,101,267 A * | 8/2000 | Shiraishi | 382/151 |
| 6,108,089 A * | 8/2000 | Shiraishi | 356/375 |
| 6,120,950 A * | 9/2000 | Unno | 430/30 |
| 6,141,107 A | 10/2000 | Nishi et al. | 356/401 |
| 6,160,623 A * | 12/2000 | Uchiyama et al. | 356/401 |
| 6,163,376 A * | 12/2000 | Nomura et al. | 356/401 |
| 6,219,130 B1 * | 4/2001 | Kawakubo | 355/67 |

* cited by examiner

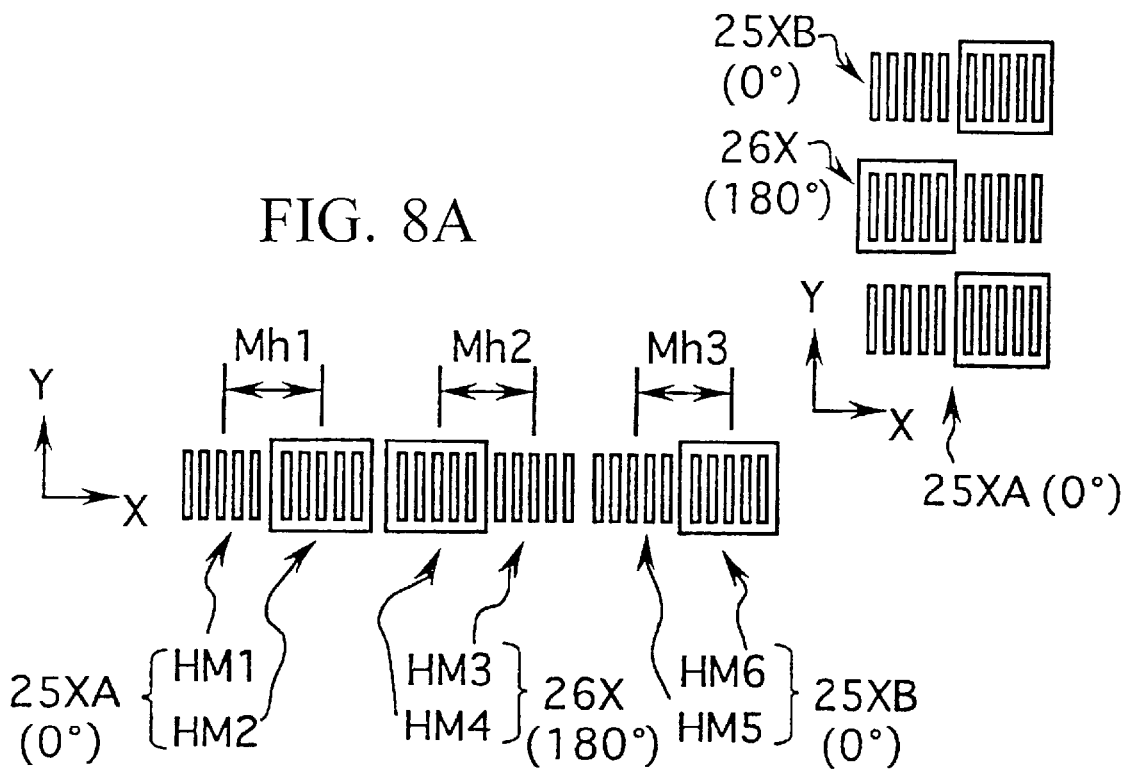

ADJUSTING METHOD FOR POSITION DETECTING APPARATUS

TECHNICAL FIELD

The present invention relates to an adjusting method for a position detecting apparatus which detects the position or the like of a to-be-detected mark by receiving a flux of light from the to-be-detected mark, and is suitable for use in adjusting an alignment sensor provided in an exposure system that is used in a lithography process for forming a fine pattern of, for example, a semiconductor integrated circuit, an image pickup device (CCD or the like), a liquid crystal display or a thin film magnetic head or the like, or an overlay error measuring apparatus or the like for measuring an error in overlaying a plurality of layers on a substrate. This application is a continuation application based on PCT/JP99/00551 designating U.S.A.

BACKGROUND ART

In manufacturing semiconductor integrated circuits, use is made of a projection aligner (stepper or the like) which transfers the image of a pattern of a reticle used as a mask onto the shot areas on a wafer (or a glass plate or the like) on which a photoresist has been applied. For example, a semiconductor integrated circuit is formed by overlaying several tens of layers of circuit patterns on a wafer in a predetermined positional relationship. When, for example, the circuit patterns of the second and subsequent layers are projection-transferred onto the wafer, therefore, it is necessary to maintain, with high precision the alignment between the circuit patterns (existing patterns) that have been formed in the individual shot areas on the wafer in the preceding processes with the image of a pattern of the reticle to be exposed next. The projection aligner is therefore equipped with an alignment sensor which detects the position of alignment marks (wafer marks) provided in each shot area on the wafer together with the circuit pattern.

While there are various types of alignment sensors, an image-forming type (image processing type) which is unlikely to be affected by asymmetry of the wafer marks has become widespread recently. This type has an optical system with a similar structure to that of a microscope, picks up the image of a wafer mark magnified by an objective lens using an image pickup device and detects the position of that wafer mark from the image signal.

Further, an overlaying error measuring apparatus (registration measuring apparatus) is used to check the precision of overlaying of a pattern which has undergone overlaying exposure by the projection aligner on the existing patterns. While a position detecting apparatus provided in the overlaying error measuring apparatus is also an optical system similar to the image-forming type alignment sensor equipped in the exposure system, the target for measurement is the amount of misregistration between the relative positions of an underlying mark (existing mark) and an overlaying mark (new mark), not the position of a single wafer mark (absolute position).

If there remains an error in the optical characteristics of the optical system of the alignment sensor or the position detecting apparatus in the overlaying error measuring apparatus, i.e., an aberration (coma or the like) of the detecting optical system of an image-forming system or the like, or an adjustment error of the illumination system (misregistration of the aperture stop of the illumination system), the error in the optical characteristics produces an error in the detected position. This error is generally called TIS (Tool Induced Shift) because it originates from a tool.

With regard to this, there has recently been proposed a method of adjusting the optical system of a position detecting apparatus to reduce the TIS based on the measured value of the distance between two types of recessed and protruding marks (step marks) having different amounts of steps (hereinafter, this method will be called "different step mark method"). This different step mark method is disclosed in, for example, T. Kanda, K. Mishima, E. Murakami and H. Ina: Proc. SPIE, Vol. 3051, pp. 846–855 (1997). Specifically, the method measures a distance D1 between two recessed and protruding marks having different amounts of steps on a wafer, turns the wafer 180° and then measures a distance D2 between those two recessed and protruding marks again. In this case, the TIS is half the difference between the measured value at a rotational angle of 0° and the measured value at a rotational angle of 180°, i.e., (D1–D2)/2, and the optical system is adjusted in such a way that this TIS falls within an allowable range.

The overlaying error measuring apparatus often has a box-in-box mark, which comprises a mark on the outer frame and a mark on the inner frame, as measuring targets. Given that the amount of two-dimensional misregistration of the center of the inner frame mark which is measured with respect to the center of the outer frame mark on a substrate for evaluation is ($\Delta$X1, $\Delta$Y1) and the amount of two-dimensional misregistration of the centers of both marks which is acquired through remeasurement after the wafer is turned 180° is ($\Delta$X2, $\Delta$Y2), (Ta, Tb), the TIS of the overlaying error measuring apparatus becomes (($\Delta$X1+$\Delta$X2)/2, ($\Delta$Y1+$\Delta$Y2)/2). In this case, the optical system is also adjusted in such a way that (Ta, Tb) as the TIS falls within an allowable range.

Conventionally, as described above, the different step mark method has been proposed to correct TIS which is a tool-induced error of the position detecting apparatus. However, the different step mark method has the disadvantage that it is difficult to accurately form two types of recessed and protruding marks, set to have predetermined steps, close to each other while the amounts of their steps are different from each other.

Even if it is possible to accurately form recessed and protruding marks with different steps, the different step mark method may be unable to adjust for the aberration of the detecting optical system with high precision even though it is effective in adjusting the position of the aperture stop of the illumination system.

Further, to correct the TIS, conventionally, after the distance or the relative misregistration between a pair of marks for evaluation on a predetermined substrate is measured, the substrate is turned 180° and the distance or the relative misregistration between the pair of marks is measured again to acquire the TIS. This disadvantageously increases the time required for the measuring operation. Normally, after the TIS is acquired in this manner and a predetermined optical member is adjusted, it is necessary to perform an operation of turning the substrate 180° and taking a measurement, and an operation of adjusting the predetermined optical member until the TIS actually falls within the allowable range. This brings about such disadvantages that the time needed for the measurement and adjustment becomes extremely long and when the rotational angle of the substrate cannot be set exactly to 180°, a measuring error remains.

Further, provision of a rotary stage which can turn the substrate 180° on a stage where the substrate is to be placed complicates and enlarges the structure of the stage, and is therefore not practical. If the substrate is temporarily removed from the stage after measuring the distance or the like between a pair of marks on the substrate on the stage and then the substrate is turned 180° and placed again on the stage, foreign matter may adhere to the substrate and the work of placing and removing the substrate is troublesome.

Further, conventionally, after the distance between two marks with different steps is detected, those marks are turned 180°, the distance is measured again and the difference between the two detected distances is taken as the TIS. This means that the average value of the results of the two detections of the distances is considered as a reference value (true value) of the distance between the two marks with different steps. When such two marks with different steps are turned 180°, however, the shapes of the marks as a whole are changed so that an error other than TIS, such as distortion, may enter the results of the distance detections.

In view of the above, it is a first object of this invention to provide an adjusting method for a position detecting apparatus, which can easily and accurately form the necessary marks for measuring the optical characteristics of the optical system.

Further, it is a second object of this invention to provide an adjusting method for a position detecting apparatus, which can accurately form necessary marks for measuring the optical characteristics of the optical system and correct a predetermined aberration of a detecting optical system or an adjustment error of an illumination system with high precision.

It is a third object of this invention to provide an adjusting method for an optical system, which can measure a tool-induced error (TIS) in a short period of time and with high accuracy.

Further, it is a fourth object of this invention to provide a substrate for evaluation which can be used in implementing the aforementioned adjusting methods.

It is a fifth object of this invention to provide an adjusting method for a position detecting apparatus, which can correct a tool-induced error (TIS) with high accuracy.

Further, it is a sixth object of this invention to provide an adjusting method for a position detecting apparatus which can accurately form the necessary marks for measuring the optical characteristics and correct a predetermined aberration of a detecting optical system or an adjustment error of an illumination system with high precision.

Furthermore, it is a seventh object of this invention to provide a position detecting apparatus or a pattern detecting apparatus which can employ such adjusting methods.

It is also an object of this invention to provide an exposure system equipped with the position detecting apparatus, a method of manufacturing such an exposure system, and a method of fabricating a device, which uses the aforementioned adjusting methods.

DISCLOSURE OF THE INVENTION

A first adjusting method for a position detecting apparatus according to this invention, which is equipped with a detecting optical system (10, 9, 12, 15, 16, 21) for condensing a flux of light from one to-be-detected mark or a plurality of to-be-detected marks, for detecting a position of the one to-be-detected mark or relative positions of the plurality of to-be-detected marks based on the flux of light condensed by the detecting optical system, is designed in such a way that a plurality of lattice marks (DM1, DM2) each having recesses (31a, 32a) and projections (31b, 32b) alternately and periodically provided in a predetermined measuring direction and having different ratios of the width of the recesses to the width of the projections are formed on a predetermined substrate (11) in the vicinity of one another, and measuring the distance (Md) between the plurality of lattice marks (DM1, DM2) in the measuring direction through the detecting optical system, and adjusting predetermined optical characteristic of the detecting optical system based on the measured value.

According to this invention, for example, a first lattice mark (DM1) which has recesses (31a) having a width a and projections (31b) having a width b periodically provided and a second lattice mark (DM2) which has recesses (32a) having a width c and projections (32b) having a width d periodically provided are used as marks for measuring the optical characteristics of the detecting optical system. At this time, the ratio of the width of the recesses of the first lattice mark (DM1) to the width of the projections (a:b or a/b) differs from the ratio of the width of the recesses of the second lattice mark (DM2) to the width of the projections (c:d or c/d). Note that the duty ratio with respect to one pitch of the recesses (31a) is 100×a/(a+b) (%), and the duty ratio with respect to one pitch of the recesses (32a) is 100×c/(c+d) (%), which are different. According to this invention, a plurality of lattice marks can have substantially the same step height but should be different from one another in the ratio of the width of the recesses to the width of the projections. It is therefore possible to easily and accurately form the lattice marks in a normal lithography process by using a mask on which a plurality of master patterns which have different ratios of the light shielding section to the light transmitting section are formed.

Because this invention uses a plurality of lattice marks having different ratios of the width of the recesses to the width of the projections and thus different duty ratios which express the ratio of the width of the recesses (or projections) with respect to one pitch as percentages, this adjusting method can be called the "different ratio mark method". In this case, if an asymmetrical aberration, such as coma, remains in the detecting optical system, the position of each mark image shifts in accordance with the duty ratio. Through measurement of the distance between the individual mark images, therefore, the measured distance between the individual mark images is shifted from the reference value (designed value or the like) when an asymmetrical aberration remains, and it agrees with the reference value when the asymmetrical aberration is not existed. By measuring the distance between the individual mark images and adjusting the optical characteristics in such a way that the measured value becomes the reference value by utilizing the above, an asymmetrical aberration can easily be et within an allowable range.

It is desirable that the ratio of the width of the recesses of one of the plurality of lattice marks (DM1, DM2) to the width of the projections should be 1:1. Because the image of a mark whose ratio of the width of the recesses to the width of the projections is 1:1 has very little transverse shift caused by asymmetrical aberrations, it can be used as a reference mark at the time of comparing distances.

One example of the detecting optical system is an image-forming optical system that projects images of the plurality of lattice marks onto a predetermined observation surface and one example of the optical characteristic of the detecting optical system to be adjusted is coma. As the distance between those mark images varies in high accuracy to comas, comas can be corrected with high precision.

A second adjusting method for a position detecting apparatus according to this invention, which is equipped with an illumination system (1–8) for illuminating one to-be-detected mark or a plurality of to-be-detected marks and a detecting optical system (10, 9, 12, 15, 16, 21) for condensing a flux of light from the to-be-detected marks, for detecting the position of the one tobe-detected mark or the relative positions of the plurality of to-be-detected marks based on the flux of light condensed by the detecting optical system, is designed in such a way that two lattice marks (HM1, HM2) each having recesses (33a, 35b) and projections (33b, 35a) alternately and periodically provided in a predetermined measuring direction and having such shapes that the recesses and the projections of one of the lattice marks (HM1, HM2) are the inverse of those of the other lattice marks are formed on a predetermined substrate (11) in the vicinity of each other, and measuring the distance between the two lattice marks in the measuring direction through the detecting optical system, and adjusting a predetermined optical characteristic of the illumination system based on the measured value.

According to this invention, given that the width of the recesses (33a) of the first lattice mark (HM1) in those lattice marks is narrower than the width of the projections (33b), a darklevel image of a dark level is acquired at, for example, the recesses (33a). Accordingly, the width of the projections (35a) of the second lattice mark (HM2) becomes narrower than the width of the recesses (35b), and a dark-level image of a dark level is acquired at the projections (35a). That is, there is produced a step at the portion in the first lattice mark (HM1) and the second lattice mark (HM2) where a dark-level image is obtained. If there is an adjustment error of the illumination system, such as misregistration of the aperture stop, or an uneven illuminance distribution at the location of the aperture stop, the distance between the images of those two lattice marks is shifted, so that the adjustment error of the illumination system can be corrected by adjusting that distance in such a way as to reach a predetermined reference value. In this case too, those lattice marks can be formed easily and accurately by using a predetermined mask.

In this case, one example of the optical characteristic of the illumination system to be adjusted is the position in the plane perpendicular to the optical axis of the aperture stop (3) in the illumination system.

Further, in the above-described second adjusting method, with the two lattice marks (HM1, HM2) on the substrate (11) being first lattice marks, two second lattice marks (DM1, DM2) each having recesses and projections alternately and periodically provided in the measuring direction and having different ratios of the width of the recesses to the width of the projections may be formed on the substrate in the vicinity of each other, and after the predetermined optical characteristic of the illumination system is adjusted based on the distance between the first lattice marks (HM1, HM2), the distance between the second lattice marks (DM1, DM2) in the measuring direction may be measured through the detecting optical system, and a predetermined optical characteristic of the detecting optical system may be adjusted based on the measured value.

This combines the use of the second adjusting method and the first adjusting method (different ratio mark method) of this invention. At this time, the adjustment of the predetermined optical characteristic of the illumination system which uses the first lattice marks (HM1, HM2) is not affected by an aberration of the detecting optical system. Accordingly, the illumination system is adjusted first by using the first lattice marks (HM1, HM2), and then an asymmetrical aberration of, for example, the image-forming optical system is adjusted by the different ratio mark method (first adjusting method) so that both can be adjusted independently, which is convenient.

It is desirable that in the aforementioned first or second adjusting method, the plurality of lattice marks (DM1, DM2; HM1, HM2) should be formed in series in the measuring direction on the substrate and close to one another. This can ensure high-precision measurement of the distance between those mark images in the measuring direction without a so-called Abbe error and ensure high-precision correction of an optical error. Further, it is desirable that the steps of the recesses (31a, 32a; 33a, 35b) and the steps of the projections (31b, 32b; 33b, 35a) substantially lie within a range of 40 to 60 nm. This can provide a high-contrast image so that the distance between a plurality of marks can be detected with high precision.

A first position detecting apparatus according to this invention, which is equipped with a detecting optical system (10, 9, 12, 15, 16, 21) that condenses a flux of light from one to-be-detected mark or a plurality of to-be-detected marks and a photoelectric detector (22) that receives the flux of light condensed by the detecting optical system, which detects the position of the one to-be-detected mark or relative positions of the plurality of to-be-detected marks based on a detection signal from the photoelectric detector, comprises a positioning member (16a, 16b, 17a, 17b), which is connected to the detecting optical system, and which positions at least a part of the optical member (16) in the detecting optical system which affects a predetermined optical characteristic (e.g., within a plane perpendicular to the optical axis of the detecting optical system), and a control operation system (23), which is electrically connected to the positioning member, and which drives the positioning member in order to reduce an error in the predetermined optical characteristics based on the distance between a plurality of predetermined lattice marks with respect to a predetermined measuring direction, which is detected through the detecting optical system and the photoelectric detector. According to this invention, the first adjusting method for a position detecting apparatus of this invention can be used.

A second position detecting apparatus according to this invention, which is equipped with an illumination system (1–8) that illuminates one to-be-detected mark or a plurality of to-be-detected marks, a detecting optical system (10, 9, 12, 15, 16, 21) that condenses a flux of light from the to-be-detected marks, and a photoelectric detector (22) that receives the flux of light condensed by the detecting optical system, which detects the position of the one to-be-detected mark or relative positions of the plurality of to-be-detected marks based on a detection signal from the photoelectric detector, comprises a positioning member (4a, 4b, 5a, 5b), which is connected to the illumination system, and which positions at least a part of the optical member (3) in the illumination system which affects a predetermined optical characteristic (e.g., within a plane perpendicular to the optical axis of the illumination system), and a control operation system (23), which is electrically connected to the positioning member, and which drives the positioning member in order to reduce an error in the predetermined optical characteristic based on the distance between predetermined plural lattice marks with respect to a predetermined measuring direction, which is detected through the detecting optical system and the photoelectric detector. According to this invention, the second adjusting method for a position detecting apparatus of this invention can be used.

An optical-system adjusting method according to this invention, which adjusts a predetermined optical characteristic of at least one of an illumination system (1–3, 6–8) for irradiating illumination light onto a to-be-detected subject and a detecting optical system (10, 9, 12, 15, 16, 21) for condensing a flux of light from the to-be-detected subject, is designed in such a way that forming first and second to-be-detected marks (HM1, HM2; 28A) on a substrate (11A) for evaluation in a predetermined positional relationship, forming third and fourth to-be-detected marks (HM3, HM4; 28B) which are the two to-be-detected marks rotated by a predetermined angle with the positional relationship maintained, measuring the relative positions of the first and second to-be-detected marks (HM1, HM2; 28A) on the substrate through the detecting optical system, measuring the relative positions of the third and fourth to-be-detected marks (HM3, HM4; 28B) on the substrate through the detecting optical system without rotating the substrate; and adjusts at least one of the illumination system and the detecting optical system based on the relative positions measured for the two sets of to-be-detected marks.

According to this invention, after the relative positions (e.g., the distance D1) of the first and second to-be-detected marks on the substrate are measured first, the relative positions (e.g., the distance D2) of the third and fourth to-be-detected marks on the substrate are measured without turning the substrate. As a result, for example, the TIS (Tool Induced Shift) which is a tool-caused error is (D1–D2)/2, and at least one of the illumination system and the detecting optical system is adjusted in such a way that this error falls within a predetermined allowable range. As the substrate need not be turned at this time, and if these two sets of to-be-detected marks have only to be sequentially placed in the observation view field of the detecting optical system, an ordinary stage which can perform two-dimensional positioning can be used, thus making it possible to measure the error in a short period of time with high precision.

In this case, as one example, at least one of the illumination system or the detecting optical system has only to be adjusted in such a way that the distance measured for the first and second to-be-detected marks becomes equal to the distance measured for the third and fourth to-be-detected marks. Accordingly, adjustment can be carried out in such a way as to substantially minimize the TIS.

As the first and second to-be-detected marks, a pair of box-in-box marks (28A) may be used. In this case, the TIS of, for example, an overlaying error measuring apparatus is measured.

A pair of lattice marks (HM1, HM2) each having recesses (33a, 35b) and projections (33b, 35a) alternately and periodically provided in a predetermined measuring direction and having such shapes that the recesses and the projections of one of the lattice marks are the inverse of those of the other one of the lattice marks, may be used as the first and second to-be-detected marks. In this case, it is possible to measure and adjust, with high precision, an error caused by, for example, misregistration of the center of the aperture stop of the illumination system.

A pair of lattice marks (DM1, DM2) each having recesses (31a, 32a) and projections (31b, 32b) provided at a predetermined pitch and having different ratios of the width of the recesses to the width of the projections, and thus different duty ratios which express the ratio of the width of the recesses (or projections) with respect to one pitch as percentages, may be used as the first and second to-be-detected marks. In this case, it is possible to measure and adjust an error originated from an asymmetrical aberration, such as coma, of the detecting optical system.

It is desirable that the third and fourth to-be-detected marks are the first and second to-be-detected marks rotated by 180°. Accordingly, the TIS as conventionally defined can be measured.

A first substrate (11A; 11B) for evaluation according to this invention, which has a plurality of to-be-detected marks formed thereon, is designed in such a way that the first and second to-be-detected marks (HM1, HM2, 28A; DM1, DM2) are formed in a predetermined positional relationship and the third and fourth to-be-detected marks (HM3, HM4, 28B; DM2, DM4) which are the two to-be-detected marks rotated by a predetermined angle with the same positional relationship are formed. By using this substrate, the adjusting method for an optical system according to this invention can be implemented.

A second substrate (11) for evaluation according to this invention, which has a plurality of to-be-detected marks formed thereon, is designed in such a way that at least two first to-be-detected marks (DM1, DM2) having recesses and projections alternately provided and having different ratios of the width of the recesses to the width of the projections are formed. By using this substrate, a position detecting apparatus can be adjusted with the aforementioned different ratio mark method.

As one example, this substrate is used in adjusting an optical apparatus which is to be incorporated in an apparatus which is used in a device fabricating process including a lithography process for transferring a device pattern onto a work piece (W) directly or through a mask (R). As one example, this substrate is substantially the same as a subject to be detected by the optical apparatus in shape and size, thus eliminating the need for newly producing a holder or the like.

A pattern detecting apparatus according to this invention, which is equipped with an illumination system (1–3, 6–8) that irradiates illumination light onto a to-be-detected subject through an objective optical system L10) and a detecting system (9, 12, 15, 16, 18, 21) that receives a flux of light which is generated from the to-be-detected subject and passes the objective optical system (10), comprises a movable member (11A) on which a pair of first marks (HM1, HM2) arranged along a first direction and a pair of second marks (HM3, HM4; 25Y) arranged along a second direction which crossing the first direction (including the case of turning the marks 180°) and having the same structure as the pair of first marks are provided integrally, and an adjusting mechanism (4a, 4b, 5a, 5b, 16a, 16b, 17a, 17b) which adjusts at least a part of the optical member (3, 16) in the illumination system, the objective optical system and the detecting system based on relative positional information acquired by detecting the pair of first marks through the objective optical system and relative positional information acquired by detecting the pair of second marks.

According to this pattern detecting apparatus, the adjusting method for an optical system according to this invention can be used. Further, it is possible to two-dimensionally adjust the optical characteristics.

A third adjusting method for a position detecting apparatus according to this invention, which is equipped with an illumination system (1–3, 6–8) for illuminating one to-be-detected mark or a plurality of to-be-detected marks and a detecting optical system (10, 9, 12, 15, 16, 21) for condensing a flux of light from the to-be-detected marks, for detecting the position of the one to-be-detected mark or relative positions of the plurality of to-be-detected marks based on the flux of light condensed by the detecting optical system., is designed in such a way that a substrate (11C) formed with an evaluation mark (DX, HX) having a center portion (DM22; HM22) comprised of a recess and projection pattern and two end portions (DM21, DM23; HM21, HM23) each having a recess and projection pattern arranged symmetrically in such a way as to sandwich the center portion in a predetermined measuring direction is placed in a to-be-detected area of the detecting optical system, and detecting the relative positional relationship (distance, dethroughtion or the like) of the center portion and the two end portions in the measuring direction through the detecting optical system, and adjusting a predetermined optical characteristic of the illumination system or the detecting optical system based on the measured value.

According to this invention, as one example, the distances between the center portion and both end portions of an evaluation mark are detected, and those distances are compared with a predetermined reference value (a true value) to determine the tool-induced error (TIS). At this time, a possible way of determining the reference value is to turn the evaluation mark 180°, remeasure the distances and take an average value of the results of the two measurements as the reference value. In this case, as the evaluation mark in this invention is symmetrical (line symmetrical) to the center portion in the measuring direction, the shape in the measuring direction is substantially the same even if the evaluation mark is turned 180°. Therefore, errors other than the tool-induced error, such as distortion, will not affect the measurement, and only the tool-induced error can be determined with high precision and thus that error can be corrected with high precision.

As one example, if the center portion and both end portions that constitute the evaluation mark are lattice marks with different ratios of the width of the recesses to the width of the projections (different ratio marks), it is possible to form the evaluation mark accurately and measure the image-forming optical state of the detecting optical system, particularly, an error in coma.

If the center portion and both end portions that constitute the evaluation mark are lattice marks whose recesses and projections are reversed (different step marks), it is possible to measure misregistration in the illumination state of the illumination system (misregistration of the illumination aperture stop, uneven illuminance distribution or the like) with high precision.

A third position detecting apparatus according to this invention, which is equipped with an illumination system (1–3, 6–8) that illuminates one to-be-detected mark or a plurality of to-be-detected marks, a detecting optical system (10, 9, 12, 15, 16, 21) that condenses a flux of light from the to-be-detected marks and a photoelectric detector (22) that receives the flux of light condensed by the detecting optical system, which detects a position of the one to-be-detected mark or relative positions of the plurality of to-be-detected marks based on a detection signal from the photoelectric detector, is designed in such a way that a positioning member, which is corrected at least a part of the optical member (3; 16) in the illumination system and the detecting optical system which affect a predetermined optical characteristic, and which positions the at least a pair of the optical member; and a control operation system (23), which is electrically connected to the photoelectric detector and the positioning member, and which drives the positioning member in order to reduce an error in the predetermined optical characteristics based on a relative positional relationship of at least three portions (DM21–DM23; HM21–HM23) of a predetermined evaluation mark to be detected through the detecting optical system and the photoelectric detector are provided. This apparatus can use the third adjusting method for a position detecting apparatus according to this invention.

In exposure system according to this invention, which has the aforementioned position detecting apparatus of this invention, a mask stage (54, 55) which holds a mask and a substrate stage (58, 59) which positions a substrate (W) onto which a pattern of the mask is to be transferred and on which an alignment mark for alignment is formed, are designed in such a way that positional information of the alignment mark on the substrate is detected by the position detecting apparatus and alignment of the mask with the substrate is carried out based on the detection result. A high degree of overlaying accuracy can be obtained by adjusting the optical system of the position detecting apparatus according to this invention by using the adjusting method of this invention.

A device manufacturing method according to this invention, which manufactures a predetermined device by using an adjusting method for the position detecting apparatus of this invention, includes the steps of adjusting a predetermined optical system in the position detecting apparatus by using the adjusting method, detecting positional information of an alignment mark on a predetermined substrate using the adjusted position detecting apparatus and aligning the substrate with a mask based on the detection result, and transferring a pattern of the mask onto the substrate. In this case, as high overlaying precision can be obtained, high-performance devices can be mass-produced with a high yield.

According to this invention, a method of manufacturing an exposure system which exposes a photosensitive substrate (W) with an energy beam through a mask (R) is such that providing a mark detecting system (63) which detects an alignment mark (38, 40X, 40Y) on the substrate, and the detecting system is provided in such a way that an optical axis is located outside an illumination area of the energy beam on a coordinate system where the substrate moves, and to detect a distance between at least two to-be-detected marks each having recesses and projections alternately provided with respect to an aligned direction, detecting the at least two to-be-detected marks by the mark detecting system, and moving or replacing at least one optical element in the mark detecting system based on the detected distance in order to adjust an optical characteristic of the mark detecting system.

In this case, the mark detecting system can be adjusted with high precision by using the adjusting method of this invention, such as the different ratio mark method, and high overlaying precision is obtained.

According to this invention, an adjusting method for an optical system in a position detecting apparatus having an illumination system for irradiating illumination light onto a to-be-detected subject and a detecting optical system for condensing a flux of light from the to-be-detected subject, adjusts a first optical characteristic of the illumination system, and adjusts a second optical characteristic of the detecting optical system after the adjustment of the first optical characteristic.

According to this invention, an exposure method in an exposure system equipped with the position detecting apparatus, which is a target for the adjusting method, is designed in such a way that an alignment mark formed on a substrate is detected by the position detecting apparatus adjusted by the adjusting method, the substrate is aligned based on the mark detection result, and a predetermined pattern is exposed on the aligned substrate.

Another position detecting apparatus according to this invention comprises an illumination system that irradiates illumination light onto a to-be-detected subject, a first adjusting unit that adjusts a first optical characteristic of the illumination system, a detecting optical system that condenses a flux of light from the to-be-detected subject, a second adjusting unit that adjusts a second optical characteristic of the detecting optical system, and a control unit that adjusts the second optical characteristic by the second adjusting unit after adjusting the first optical characteristic by the first adjusting unit.

Another exposure system according to this invention comprises another position detecting apparatus of this invention, and an alignment apparatus that detects an alignment mark formed on a substrate by using the position detecting apparatus adjusted by the first and second adjusting units and aligning the substrate based on the result of detection of the alignment mark, and exposes a predetermined pattern on the aligned substrate.

BRIEF DESCRIPTION OF THE DRAWINGS

FIG. 8A is an enlarged plan view depicting an example of another mark that can be used for adjustment in the second embodiment.

FIG. 8B is an enlarged plan view depicting an example of another mark that can be used for adjustment in the second embodiment.

BEST MODE FOR CARRYING OUT THE INVENTION

A preferred first embodiment of the present invention will be described below with reference to FIGS. 1 through 4.

Figure 1:
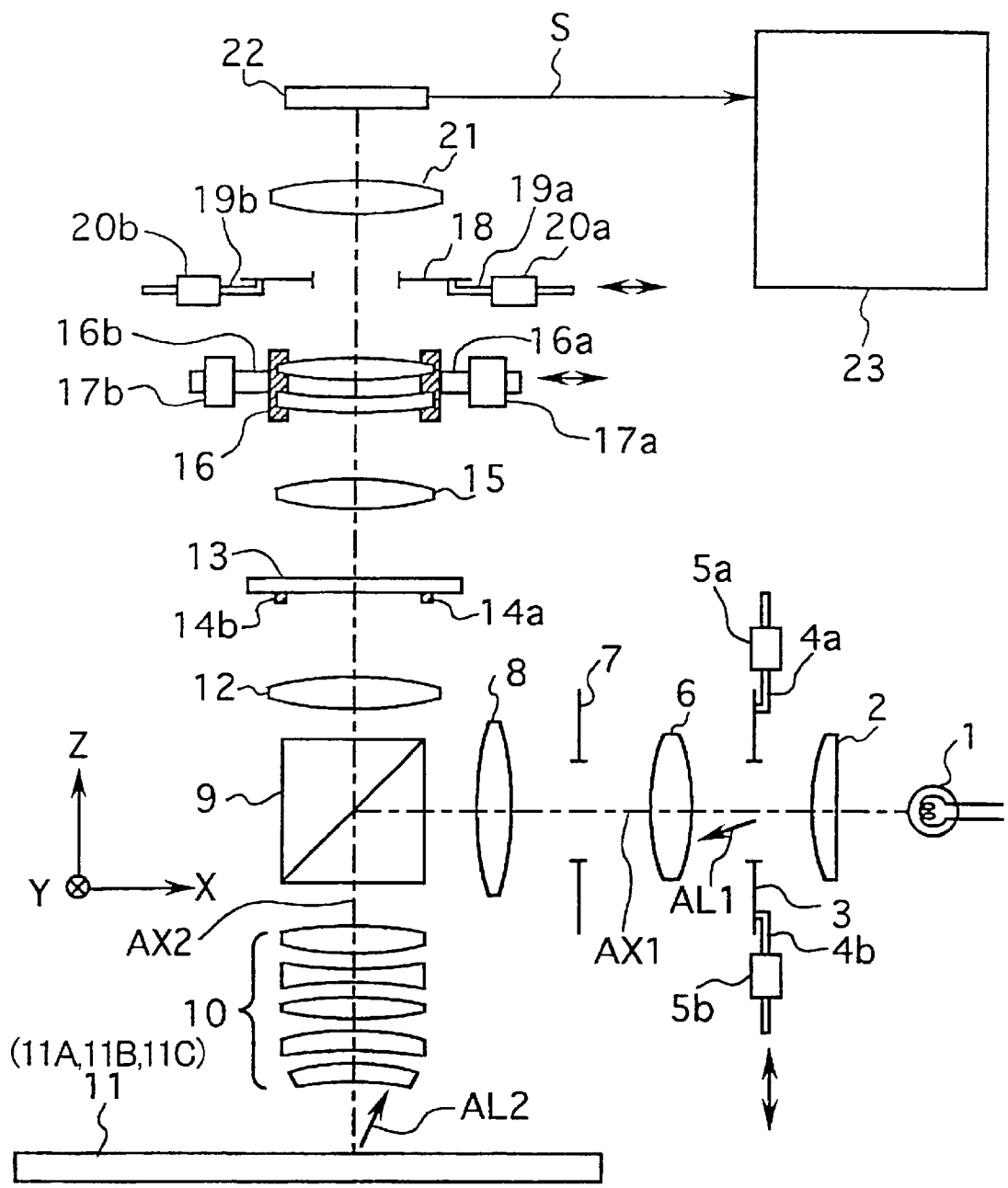
FIG. 1 is a partly cross-sectional, structural diagram showing a position detecting apparatus according to the first embodiment of this invention.

FIG. 1 shows a position detecting apparatus according to this embodiment, and the surface of a wafer 11 for adjustment is placed on a surface to be detected by the position detecting apparatus of this embodiment in FIG. 1. Plural pairs of recessed and protruding lattice marks (step marks) are formed on the surface of the wafer 11 as will be discussed later.

In FIG. 1, illumination light AL1 of a wide bandwidth which is emitted from a light source 1 such as a halogen lamp travels through a condenser lens 2, an aperture stop (hereinafter called "σ stop") 3 of an illumination system, a first release lens 6, a field stop 7 and a second release 8 and enters a half prism 9 along an optical axis AX1 of the illumination system. The illumination light AL1 which is reflected downward at the half prism 9 illuminates the wafer 11 for adjustment through objective lenses 10. A σ value, which is a coherent factor of the illumination system, is set by the σ stop 3.

A flux of light AL2 which is reflected at the wafer 11 enters the half prism 9 through the objective lenses 10. The light flux AL2 that has passed the half prism 9 forms the image of a lattice mark on the wafer 11 onto the pattern surface of an index plate 13 through a third release lens 12. That is, the pattern surface of the index plate 13 is conjugate with the surface of the wafer 11, and index marks 14a and 14b which become the reference for the detection position at the time a projection aligner performs alignment are formed on that pattern surface. It is to be noted however that when the position detecting apparatus of this embodiment is used as an overlaying error measuring apparatus, the index plate 13 is not essential.

The light flux AL2 that has passed the index plate 13 passes through a fourth release lens 15, an optical system for correction of coma (hereinafter called "coma correction optical system") 16, an aperture stop 18 and a field lens 21 and forms the image of the lattice mark on the wafer 11 and the images of index marks 14a and 14b on the image pickup surface of a two-dimensional image pickup device 22 of a CCD type or the like. An image signal S read from the image pickup device 22 is supplied to a control operation system 23. In this embodiment, the objective lenses 10, the half prism 9, the third release lens 12, the fourth release lens 15, the coma correction optical system 16 and the field lens 21 constitute an image-forming optical system as an optical system for detection. A description will now be given for the case in which the Z axis is set in parallel to an optical axis AX2 of this image-forming optical system, the X axis is set in parallel to the sheet surface of FIG. 1 in a plane perpendicular to the Z axis and the Y axis set perpendicular to the sheet surface of FIG. 1.

In this case, the numerical aperture (NA) of the image-forming optical system is determined by the aperture diameter of the aperture stop 18 in the image-forming optical system and the position of the aperture stop 18 will affect the dethroughtion of the result of detection of a mark position (hereinafter called "telecentric dethroughtion") according the amount of a positional dethroughtion (defocus amount) of the surface of the wafer 11 in the optical axis AX2 with respect to the best focus position of the image-forming optical system. The aperture stop 18 is designed in such a way that the center of the aperture stop 18 can be shifted in the X direction and the Y direction by arbitrary amounts by holding the aperture stop 18 by means of holding members 19a and 19b and shifting the holding members 19a and 19b by aperture-stop position adjusting mechanisms 20a and 20b of a feed screw type, a stretchable drive element type, such as a piezoelectric element, a voice coil motor (VCM) type, a linear motor type or the like under the control of the control operation system 23. Before measurement is initiated, the position of the aperture stop 18 is preadjusted to avoid a telecentric dethroughtion.

While the objective lenses 10 and the other optical systems are manufactured and assembled with very high precisions in the position detecting apparatus of this embodiment, various aberrations due to production errors still remain. When such remaining aberrations exceed a predetermined allowable range, it makes the position detecting precision lower than the necessary precision. The aberration with the largest negative effect on the position detecting precision is coma, which occurs due to the eccentricity of each optical member and insufficient precision of the polished surface. Therefore, even if a to-be-detected subject (to-be-detected mark) lies on the optical axis AX2 of the image-forming optical system, coma has an adverse effect.

The coma correction optical system 16 is an optical system for correcting such remaining coma and can change the state of the coma of the image-forming optical system in accordance with a change in its position. Therefore, the coma correction optical system 16 is designed in such a way that the center of the coma correction optical system 16 can be shifted in the X direction and the Y direction by arbitrary amounts by holding the coma correction optical system 16 by means of holding members 16a and 16b and shifting the holding members 16a and 16b by coma-correction-optical-system position adjusting mechanisms 17a and 17b under the control of the control operation system 23. At least one optical element other than the coma correction optical system 16 may be designed to be movable so that the optical characteristics of the image-forming optical system, i.e., aberrations other than the coma, telecentricity and the focus position, can be adjusted, and that at least one optical element may be moved to approximately cancel out a variation in the optical characteristics that is caused by the movement of the coma correction optical system 16.

When the amount of coma remaining in the optical system is large, the adjustment of the position of the coma correction optical system 16 becomes large, which may shift the position of the primary rays of the flux of image-forming light significantly from the optical axis AX2.

In this case, the relationship between the position of the aforementioned aperture stop 18 and the position of the main rays changes considerably and in the worst case, the position of the aforementioned aperture stop 18 may need to be readjusted every time the position of the coma correction optical system 16 is adjusted.

Such a possibility of readjustment can be eliminated completely by reversing the positional relationship between the aperture stop 18 and the coma correction optical system 16 to the one shown in FIG. 1 and arranging the aperture stop 18 closer to the wafer than the coma correction optical system 16.

While it is desirable to arrange the coma correction optical system 16 close to the pupil surface (aperture stop 18) in the image-forming optical system, it may of course be arranged on the conjugate surface through a relay system. The arrangement on the conjugate surface through a relay optical system has the advantage that the degree of freedom with respect to the space where the arrangement takes place is increased.

If the relationship between the position of the σ stop 3 in the illumination system from the light source 1 to the second release 8 and the position of the aperture stop 18 in the image-forming optical system changes, even the σ stop 3 adversely affects the detected position of a to-be-detected mark. It is however assumed that because the adjustment (movement) of the position of the aperture stop 18 causes a telecentric dethroughtion as mentioned above, the relationship of both positions should be matched by adjusting the position of the σ stop 3. Therefore, the σ stop 3 is designed in such a way that the center of the σ stop 3 can be shifted in the X direction and the Y direction by arbitrary amounts by holding the σ stop 3 by means of holding members 4a and 4b and shifting the holding members 4a and 4b by σ-stop position adjusting mechanisms 5a and 5b under the control of the control operation system 23.

A description will be given of one example of the adjusting method for the optical system of the position detecting apparatus in FIG. 1. First, plural pairs of recessed and protruding lattice marks (step marks) on the wafer 11 for adjustment in this embodiment will be explained.

Figure 2:
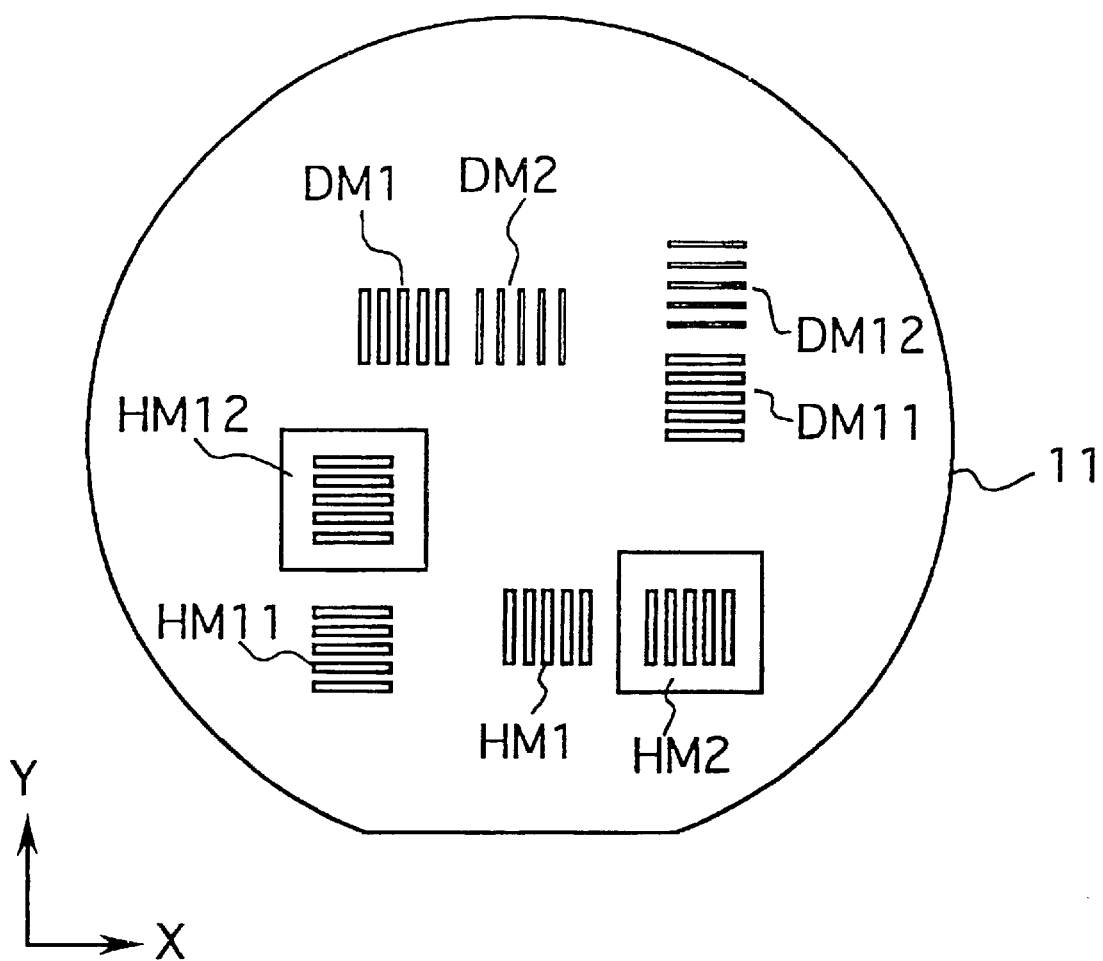
FIG. 2 is a plan view showing a plurality of lattice marks on a wafer to be used for adjustment in this embodiment.

FIG. 2 is a plan view showing the wafer 11 for adjustment in FIG. 1, and a silicon wafer is used as one example of the wafer 11 in FIG. 2. Formed on the surface of the wafer 11 are a pair of marks (DM1, DM2) along the X axis which comprise a first mark DM1 and a second mark DM2 each having cyclic recessed and protruding patterns in the X direction and both provided in series, and a pair of marks (DM11, DM12) along the Y axis which comprise a first mark DM11 and a second mark DM12 that have shapes obtained by turning the former pair of marks by 90°. Those two pairs of marks (DM1, DM2) and marks (DM11, DM12) are used for adjusting the characteristics of the detecting optical system.

Also formed on the surface of the wafer 11 are a pair of marks (HM1, HM2) along the X axis which comprise a first mark HM1 and a second mark HM2 provided in series to this mark in the X direction and having reversed recessed and protruding patterns thereof, and a pair of marks (HM11, HM12) along the Y axis which comprise a first mark HM11 and a second mark HM12 that have shapes obtained by turning the former pair of marks by 90°. Those two pairs of marks (HM1, HM2) and marks (HM11, HM12) are used for adjusting the characteristics of the illumination system.

When, for example, a silicon wafer is used as the wafer 11, those recessed and protruding lattice marks can be formed with a very high accuracy through steps, such as application of a photoresist onto this wafer, exposure of the projection image of the corresponding reticle pattern, developing of the photoresist, etching and resist separation.

Figure 3A:
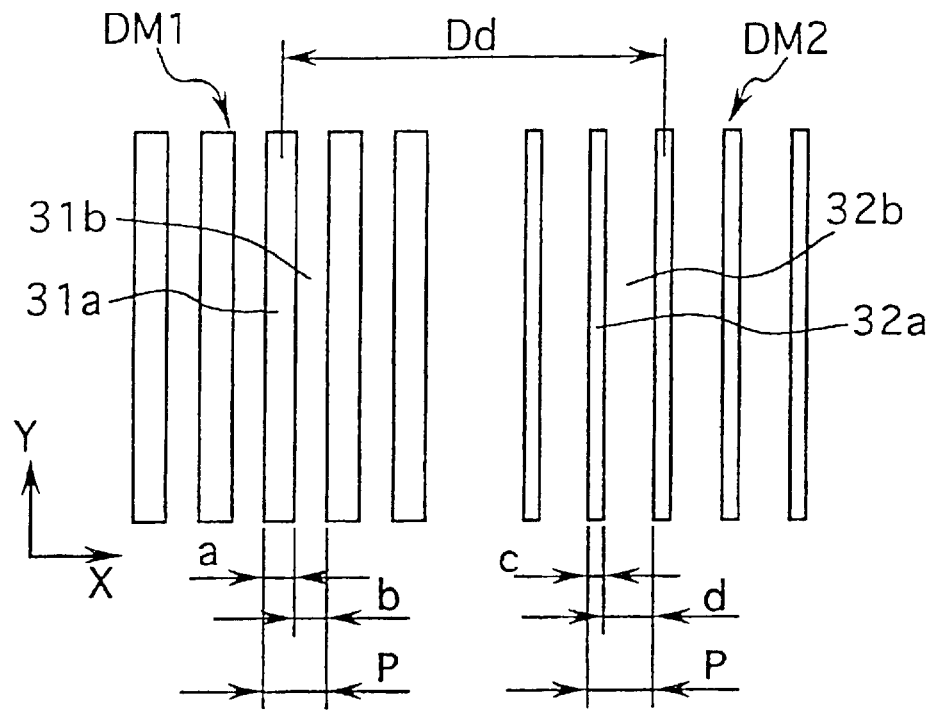
FIG. 3A is a front view of marks for adjusting the characteristics of the detecting optical system in FIG. 2.
Figure 3B:
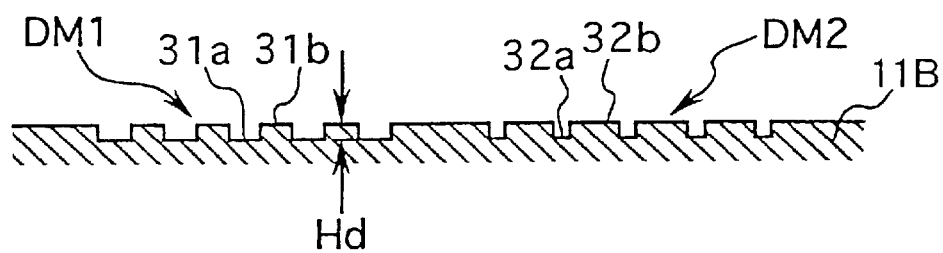
FIG. 3B is a cross-sectional view of marks for adjusting the characteristics of the detecting optical system in FIG. 2.

FIG. 3A is an enlarged plan view illustrating a pair of marks (DM1, DM2) along the X axis for adjusting the characteristics of the detecting optical system shown in FIG. 2 and FIG. 3B is a cross-sectional view of FIG. 3A in which the first mark DM1 has five narrow linear recessed patterns 31a with a line width a formed on the surface of the wafer 11 at a pitch P in a lattice form in the X direction with a predetermined step Hd, the pitch P being about 5 to 20 μm. Likewise, the second mark DM2 has five narrow linear recessed patterns 32a with a line width c formed on the surface of the wafer 11 at the same pitch P in a lattice form in the X direction with the step Hd. In the X direction which is the measuring direction, the distance between the center of the first mark DM1 and the center of the second mark DM2 is set to a designed value of Dd. This distance Dd is approximately 50 to 100 μm.

It is desirable that the step (depth) Hd of each mark DM1, DM2 should be set to approximately 40 to 100 nm. If this step Hd is too small, the contrast of the images of those marks drops (the mark portions do not become sufficiently dark), lowering the position detecting precision. If this step Hd becomes greater than about 100 nm, adverse step-induced geometrical optic effects, such as vignetting, occur, making it difficult to get highly accurate measurements. Further, to obtain an image with excellent contrast for each mark, it is desirable that the step be 40 to 60 nm.

In this embodiment, the ratio (a:b or a/b) of the width a of the recessed patterns 31a of the first mark DM1 to the width b of protruding patterns 31b (a+b=P) differs from the ratio (c:d or c/d) of the width c of the recessed patterns 32a of the second mark DM2 to a width d of protruding patterns 32b (c+d=P). In other words, the duty ratio (100×a/P (%)) of the width a of the recessed patterns 31a of the first mark DM1 with respect to the pitch P differs from the duty ratio (100×c/P (%)) of the width c of the recessed patterns 32a of the second mark DM2 with respect to the pitch P. As one example, the duty ratio of the recessed patterns 31a of the first mark DM1 is set to 50% and the ratio of the width a of the recessed patterns 31a to the width b of the protruding patterns 31b is set as follows in this embodiment.

$$a:b=1:1, \text{ or } a/b=1 \tag{11}$$

The duty ratio of the recessed patterns 32a of the second mark DM2 is set to about 10% and the ratio of the width c of the recessed patterns 32a to the width d of the protruding patterns 32b is about set as follows.

$$c:d=1:9, \text{ or } c/d=1/9 \tag{12}$$

Figure 3C:
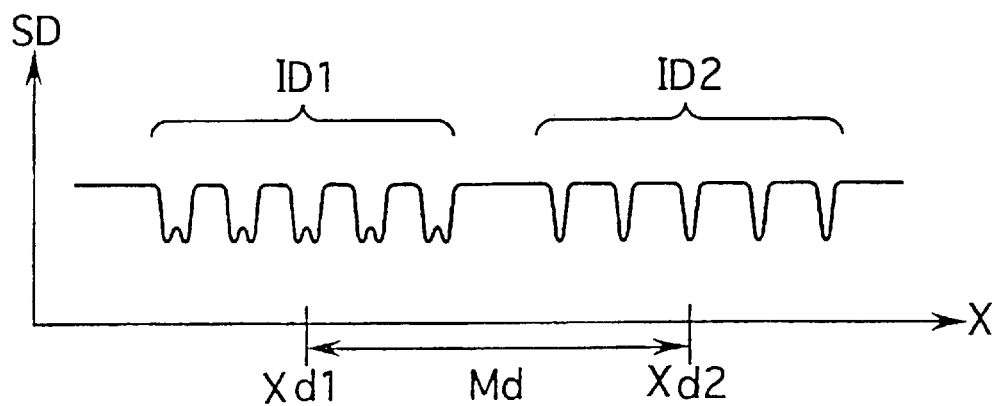
FIG. 3C is an image signal obtained from the images of the marks.

In the case where the two marks DM1 and DM2 arranged close to each other in the X direction in the above manner are observed by the position detecting apparatus in FIG. 1, an image signal obtained by reading their images in the X direction by the image pickup device 22 is an image signal SD in FIG. 3C. This image signal SD may be acquired by averaging an image signal, obtained by scanning the images of the two marks in FIG. 3A in the X direction, in the non-measuring direction (Y direction).

In FIG. 3C, the horizontal axis represents a position X in the measuring direction, and the position X actually represents a position which is obtained by multiplying the position from a predetermined reference point on the image pickup surface of the image pickup device 22 by 1/α by using a magnification factor a from the surface of the wafer 11 in FIG. 1 to the image pickup surface of the image pickup device 22. In the image signal SD in FIG. 3C, the edge portion of the first mark DM1 becomes a dark portion at a portion ID1 corresponding to the image of the first mark DM1 and the edge portion likewise becomes a dark portion at a portion ID2 corresponding to the image of the second mark DM2.

The control operation system 23 in FIG. 1 determines the distance Md between a center position Xd1 of the portion ID1 and a center position Xd2 of the portion ID2 from the image signal SD. With no aberration present in the detecting optical system, this distance Md should become the designed distance Dd in FIG. 3A. If coma remains in the detecting optical system, however, the amount of change in the image position caused by the coma differs due to a difference between the duty ratios of the widths of the recessed patterns 31a and 32a of both marks DM1 and DM2, so that the distance MD does not coincide with Dd. Because it is possible to determine not only the level of the remaining coma but also the sign from the relationship between the measured distance Md and the distance Dd which becomes a reference, the control operation system 23 in FIG. 1 adjusts the position of the coma correction optical system 16 through the coma-correction-optical-system position adjusting mechanisms 17a and 17b in such a way as to make the error Δ Md smaller based on the sign and size of the error ΔMd (=Dd−Md) of the distance Md with respect to the distance Dd.

After the adjustment of the position of the coma correction optical system 16, the distance Md between the images of both marks DM1, DM2 is measured again, and if the error ΔMd with respect to this reference value Dd is outside of the allowable range, the aforementioned adjustment is carried out again. As the above-described steps are repeated until the error ΔMd falls within the allowable range, the adjustment of the coma of the detecting optical system is completed. Because the adjusting method of this embodiment measures the distance between the marks with different duty ratios, it is called "different ratio mark method".

There are various methods, such as the slice method and correlation method, for the algorithm of detecting the position of each mark image in the above-described position detecting process, and any one of them may be used in this embodiment. For example, the slice method performs position detection based on the slice position of the image signal SD at a predetermined slice level and the correlation method compares the image signal SD with a predetermined reference waveform and takes the position with the highest degree of correlation with the reference waveform as the position of the mark image. Although the signal waveforms that correspond to the images of the index marks 14a and 14b are not shown in FIG. 3C, the distance Md may be determined after detecting the amounts of dethroughtion of the positions of the marks DM1 and DM2 with respect to the index marks 14a and 14b.

While the distance Dd between both marks DM1 and DM2 in FIG. 3A is already known as the designed value, the actual distance Dd between the marks contains a production error of the pattern of a reticle which was used at the time of transferring those marks and a production error, such as an etching error, at the time of forming a step on the wafer 11. It is therefore desirable to measure the actual value of the reference distance Dd before the aforementioned adjustment. To accomplish this, after the distance between the images of the two marks DM1 and DM2 in FIG. 3A (referred to as Md1) are measured, the wafer 11 is turned 180° and the distance between the images of the same two marks DM1 and DM2 (let it be Md2) are measured, and the average value <Md> of those two measured values should be used instead of the reference distance Dd, as disclosed in T. Kanda, K. Mishima, E. Murakami and H. Ina: Proc. SPIE, Vol. 3051, pp. 846–855 (1997) (hereinafter called "document 1").

$$<Md> = (Md1 + Md2)/2 \quad (13)$$

Even if there is coma remains in the detecting optical system in FIG. 1, therefore, it is possible to detect the error ΔMd of the distance Md between two mark images produced by the coma.

In general, a position detecting apparatus needs to measure the mark positions in the two-dimensional directions (X direction, Y direction) or the relative positional relationship. As in the case of the aforementioned adjustment associated with the X direction, adjustment of coma associated with the Y direction can also be performed by measuring the distance between the images of a pair of marks (DM11, DM12) along the Y axis on the wafer 11 in FIG. 2.

The adjusting method for the illumination system in FIG. 1 will now be explained. First, a pair of marks (HM11, HM12) along the X axis on the wafer 11 in FIG. 2 are used.

Figure 4A:
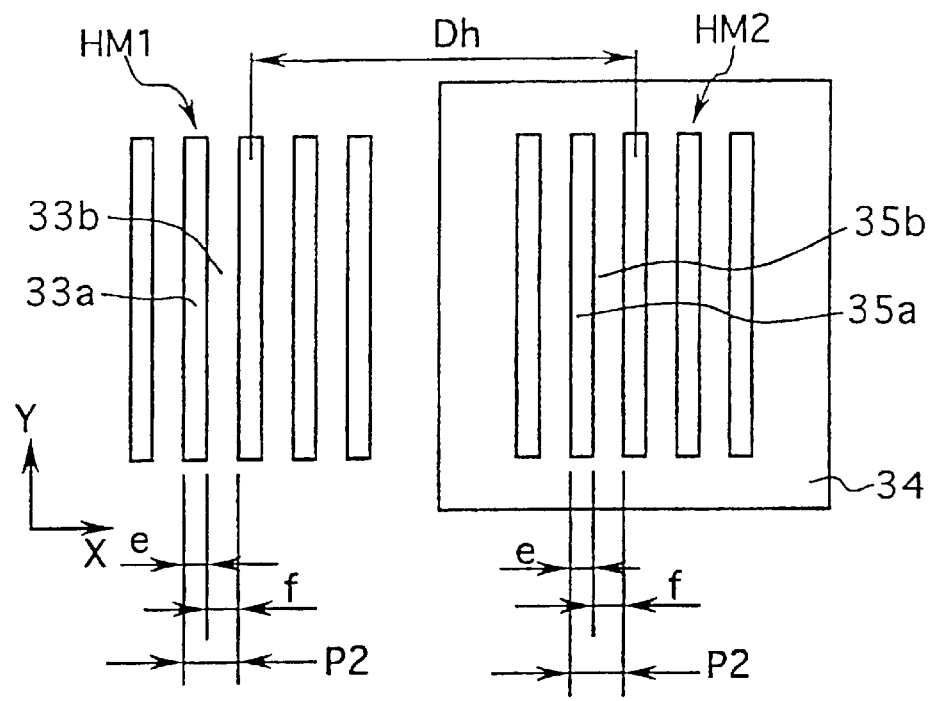
FIG. 4A is a front view of marks for adjusting the characteristics of the detecting optical system in FIG. 2.
Figure 4B:
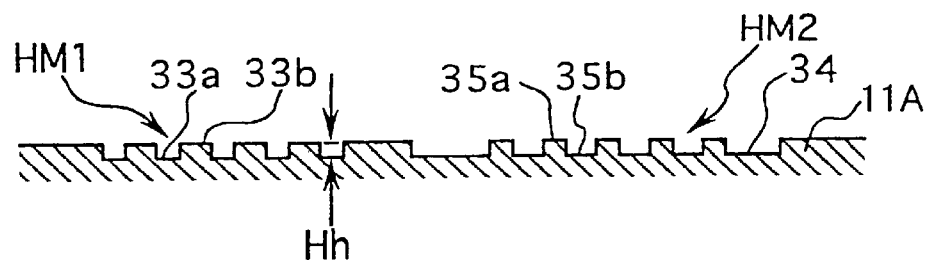
FIG. 4B is a cross-sectional view of marks for adjusting the characteristics of the detecting optical system in FIG. 2.

FIG. 4A is an enlarged plan view illustrating a pair of marks (HM1, HM2) along the X axis for adjusting the characteristics of the illumination system shown in FIG. 2 and FIG. 4B is a cross-sectional view of FIG. 4A in which the first mark HM1 has five narrow linear recessed patterns 33a with a line width e formed on the surface of the wafer 11 at a pitch P2 in a lattice form in the X direction with a predetermined step Hd, the pitch P2 being about 5 to 20 μm. Likewise, the second mark HM2 has its periphery surrounded by an engraved portion 34 and has five narrow linear protruding patterns 35a with the line width e formed at the pitch P2 in a lattice form.

The designed value of the distance between the centers of both marks HM1 and HM2 in the X direction is Dh and is about 50 to 100 μm. In this case, the first mark HM1 has the recessed patterns 33a having the width e and protruding patterns 33b having a width f (=P2−e), and the second mark HM2 has the protruding patterns 35a having the width e and recessed patterns 35b having the width f, and for marks HM1 and HM2, relations of the recesses and protrusions are reversed. That is, the duty ratio of the recessed patterns 33a of the first mark HM1 is set equal to the duty ratio of the protruding patterns 35a of the second mark HM2.

Figure 4C:
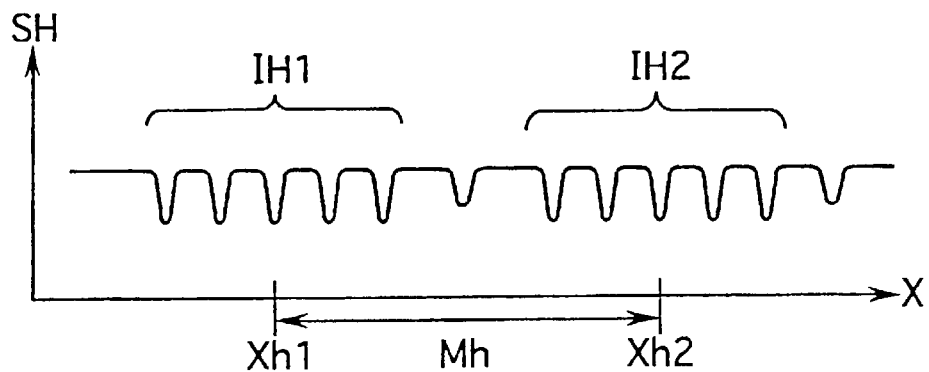
FIG. 4C is an image signal obtained from the images of the marks.

In the case where the two marks HM1 and HM2 arranged close to each other in such a manner are observed by the position detecting apparatus in FIG. 1, an image signal obtained by reading their images in the X direction by the image pickup device 22 (or the signal averaged in the non-measuring direction) is an image signal SH in FIG. 4C. In the image signal SH in FIG. 4C, mark portions at portions IH1 and IH2 corresponding to the first mark HM1 and the second mark HM2 become dark portions. The control operation system 23 in FIG. 1 detects a position Xh1 of the center of the portion IH1 of the image signal SH and a position Xh2 of the center of the portion IH2 and determines the distance Mh between them. In this case too, the distance Mh is the value obtained by multiplying the distance on the image pickup surface by 1/α by using a magnification factor a from the surface of the wafer 11 in FIG. 1 to the image pickup surface.

Without an adjustment error in the illumination system, the distance Mh obtained in the above manner should be equal to the reference distance Dh. With an adjustment error remaining in the illumination system, however, the amounts of the shifts of the images of the two marks HM1 and HM2 to be observed become different depending on the steps of the individual marks, so that the distance Mh to be measured differs from the reference distance Dh.

Specifically, according to this embodiment, the sign and size of an error ΔMh (=Dh−Mh) of the distance Mh between the images of the two marks HM1 and HM2 with respect to the reference distance Dh change greatly in accordance with the position of the σ stop 3 of the illumination system in FIG. 1. Therefore, the control operation system 23 in FIG. 1 adjusts the position of the σ stop 3 through the σ-stop position adjusting mechanisms 5a and 5b in such a way as to make the error ΔMh smaller. Thereafter, the error ΔMh in the distance Mh between the images of the two marks HM1 and HM2 is measured again, and the adjustment of the position of the σ stop 3 is completed by adjusting the position of the σ stop 3 until the error ΔMh falls within the allowable range.

It is also desirable that the step Hh of the marks MH1 and MH2, like the step Hd of the marks MD1 and MD2 in FIG. 3 should be about 40 to 100 nm. The reason for this is the same as has been given above. Further, to acquire the image signal with excellent contrast, it is also desirable that the step Hh should be about 40 to 60 nm.

It is desirable that the duty ratio of the recessed patterns 33a of the first mark HM1 (100×e/P2 (%)) and the duty ratio of the protruding patterns 35a of the second mark HM2 (100×e/P2 (%)) should be approximately 10%. This is because if the duty ratio is too small, the contrast of the mark images drops, thus decreasing the reproducibility of the position detecting results. If the duty ratio is too large, the amount of change in the amount of dethroughtion of the relative position of the images of the recessed patterns 33a of the first mark HM1 and the images of the protruding patterns 35a of the second mark HM2, which is caused by the shift of the σ stop 3 (by an adjustment error of the illumination system), becomes smaller, thus reducing the adjustment sensitivity.

As in the case of the aforementioned adjustment associated with the X direction, adjustment of an adjustment error of the illumination system associated with the Y direction can also be performed by measuring the distance between the images of a pair of marks (HM11, HM12) along the Y axis on the wafer 11 in FIG. 2.

Further, it is also desirable in the case of FIG. 4 to measure the actual value of the reference distance Dh. To accomplish this, as in the case of FIG. 3, after the distance between the images of the two marks HM1 and HM2 in FIG. 4A (let it be Mh1) is measured, the wafer 11 is turned 180° and the distance between the images of the same two marks HM1 and HM2 (let it be Mh2) is measured, and the average value of those two measured values is used instead of the reference distance Dh.

The positional adjustment of the coma correction optical system 16 in FIG. 1 and the positional adjustment of the σ stop 3 in the above-described embodiment may be carried out independently. It is to be noted that at the time of adjusting the position of the σ stop 3, even if coma remains in the detecting optical system (image-forming optical system), adjustment can be made without being influenced by the coma. It is therefore efficient to adjust the coma by adjusting the position of the σ stop 3 first and then moving the coma correction optical system 16.

Although the remaining coma is adjusted and removed by adjusting the coma correction optical system 16 in FIG. 1 in this embodiment, the present invention is not restricted to this but the remaining coma may be adjusted and removed by adjusting the positions or rotational angles of other optical members, such as the objective lenses 10 and the half prism 9. Further, at the time of adjusting the illumination state, not only the position of the σ stop 3 but also the position of the light source 1 or the position or the rotational angle of the first release lens 6 or the second release 8 may be adjusted.

[Second Embodiment]

The second embodiment of this invention will now be described with reference to FIGS. 1 and 5 to 10. As a target to be adjusted in this embodiment is also the position detecting apparatus in FIG. 1, the description of the structure of the apparatus will be omitted and only the method of adjusting its optical system will be discussed. In this embodiment, a wafer 11A is placed instead of the wafer 11 for adjustment in FIG. 1. Plural pairs of to-be-detected marks are formed on the surface of this wafer 11A. To begin with, the plural pairs of to-be-detected marks will be discussed.

Figure 5:
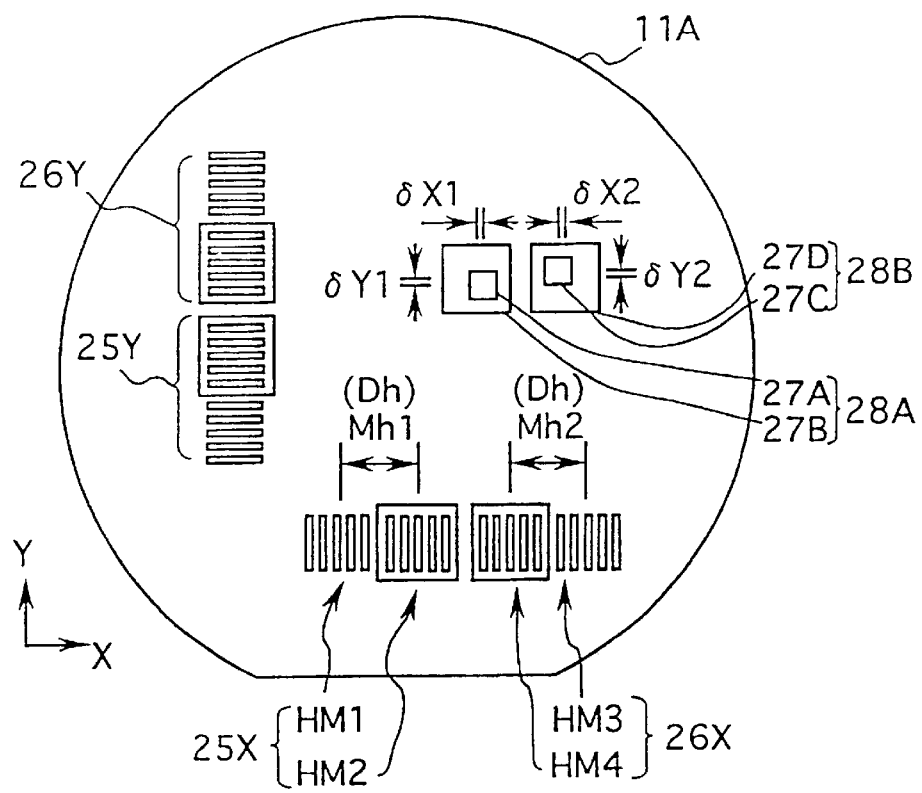
FIG. 5 is a plan view showing plural pairs of to-be-detected marks on a wafer to be used for adjustment in the second embodiment of this invention.

FIG. 5 is a plan view showing the wafer 11A for adjustment which is placed in place of the wafer 11 in FIG. 1, and a silicon wafer is used as one example of the wafer 11A in this FIG. 5. Formed on the surface of the wafer 11A is a first box-in-box mark 28A which has an inner-frame mark 27A and an outer-frame mark 27B surrounding it. Formed in the vicinity of the box-in-box mark 28A is a second box-in-box mark 28B which has an inner-frame mark 27C and an outer-frame mark 27D arranged at a position obtained by rotating as one piece the inner-frame mark 27A and the outer-frame mark 27B while keeping the positional relationship of the pair of marks 27A and 27B.

Figure 6:
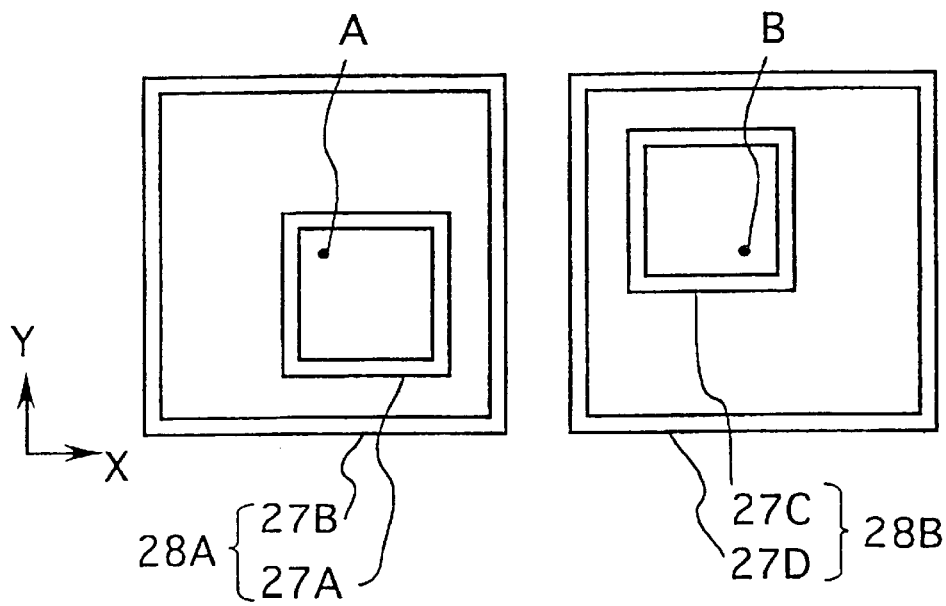
FIG. 6 is an enlarged plan view depicting two pairs of box-in-box marks 28A, 28B in FIG. 5.

FIG. 6 is an enlarged plan view depicting the box-in-box marks 28A, 28B in FIG. 5. In this FIG. 5, the first box-in-box mark 28A comprises the inner-frame mark 27A and outer-frame mark 27B each comprised of a rectangular frame-shape protruding pattern (or recessed pattern). Likewise, the second box-in-box mark 28B comprises the inner-frame mark 27C and outer-frame mark 27D respectively having the same shapes as the inner-frame mark 27A and outer-frame mark 27B. In this case, given that the amounts of positional dethroughtion (designed values) of the center of the inner-frame mark 27A in the first box-in-box mark 28A in the X direction and Y direction with respect to the center, A, of the outer-frame mark 27B are (dX1, dY1) and the amounts of positional dethroughtion (designed values) of the center of the inner-frame mark 27C in the second box-in-box mark 28B in the X direction and Y direction with respect to the center, B, of the outer-frame mark 27D are (dX2, dY2), the following relationship is satisfied from the viewpoint of design.

$$(dX2, dY2) = -(dX1, dY1) \quad (21)$$

Although there is actually a writing error of mask patterns and an error in the manufacturing process, such errors should be smaller than the detection precision that is required by the position detecting apparatus. These positional dethroughtions may be previously measured with high precision and checked by, for example, a scanning electron microscope (SEM) or the like.

In this case, if the positional dethroughtions of the inner-frame marks of those box-in-box marks 28A and 28B with respect to the outer-frame marks are detected by the position detecting apparatus in FIG. 1, the amounts of positional dethroughtion to be measured may not satisfy the relationship of the equation (21) due to an asymmetrical aberration or the like of the detecting optical system. As will be discussed later, the asymmetrical aberration or the like can be adjusted by using this phenomenon.

Further, in FIG. 5, formed on the surface of the wafer 11A are a pair of marks 25X consisting of a first mark HM1 having a pattern of cyclic recesses and projections in the X direction and a second mark HM2 having such shapes that the pattern of recesses and projections is reversed, and a pair of marks 26X located in the vicinity of the pair of marks 25X and having such shapes that the shapes of the pair of marks 25X are rotated 180°. That is, the pair of marks 26X consists of a third mark HM3 and a fourth mark HM4 which are obtained by turning the first mark HM1 and second mark HM2 as one piece by 180° while keeping their positional relationship. Given that the designed distance between the first mark HM1 and second mark HM2 in the X direction is Dh, the designed distance between the third mark HM3 and fourth mark HM4 in the X direction also is Dh.

Although the pair of marks 26X is arranged close to the pair of marks 25X in the measuring direction (X direction) in FIG. 5, they may also be arranged close to the pair of marks 25X in the non-measuring direction (Y direction). Further, a pair of marks 25Y and a pair of marks 26Y along the Y axis, whose shapes are those of the pair of marks 25X and the pair of marks 26X rotated by 90°, are formed on the surface of the wafer 11A. Those four pairs of marks 25X, 26X, 25Y and 26Y are used, as one example, in adjusting the characteristics of the illumination system.

When, for example, a silicon wafer is used as the wafer 11A, those recessed and protruding box-in-box marks and lattice marks can be formed with a very high accuracy through steps, such as application of a photoresist onto the surface of this wafer, exposure of the projection image of the corresponding reticle pattern, developing of the photoresist, etching and resist separation.

A description will now be given of one example of the adjusting method for the detecting optical system (image-forming optical system) of the position detecting apparatus in FIG. 1. For this, the centers of the outer-frame marks of the two box-in-box marks 28A and 28B on the wafer 11A in FIG. 5 are sequentially moved close to the center of the view field (optical axis AX2) of the objective lenses 10 of the position detecting apparatus in FIG. 1 and the amount of positional dethroughtion (δX1, δY1) of the center of the inner-frame mark 27A with respect to the center of the outer-frame mark 27B and the amount of positional dethroughtion (δX2, δY2) of the center of the inner-frame mark 27C with respect to the center of the outer-frame mark 27D are measured. The measured values are obtained by multiplying the amounts of positional dethroughtion on the image pickup device 22 in FIG. 1 obtained by processing the image signal S from the image pickup device 22 by the reciprocal (1/α) of the magnification a from the surface of the wafer 11A to the image pickup surface of the image pickup device 22. The movement of the wafer 11A in the X direction or the Y direction can be carried out at a high speed by using the wafer stage provided in the projection aligner or the XY stage equipped in the overlaying error measuring apparatus.

Thereafter, the control operation system 23 in FIG. 1 computes the amount of dethroughtion (δX, δY) of the measured value of the amount of positional dethroughtion of each of the two box-in-box marks 28A and 28B from the equation (21) as follows. This amount of positional dethroughtion (δX, δY) is equivalent to a part of the TIS (Tool Induced Shift) of the detecting optical system of the position detecting apparatus in FIG. 1.

$$\delta X = (\delta X1 + \delta X)/2 \tag{22A}$$

$$\delta Y = (\delta Y1 + \delta Y)/2 \tag{22B}$$

Then, the control operation system 23 adjusts the X-directional and Y-directional positions of the coma correction optical system 16 through the coma-correction-optical-system position adjusting mechanisms 17a and 17b as one example in such a way that the amount of dethroughtion (δX, δY) approaches (0, 0).

Thereafter, the centers of the outer-frame marks of the two box-in-box marks 28A and 28B on the wafer 11A in FIG. 5 are again sequentially moved into the observation field of the position detecting apparatus in FIG. 1 and the amount of positional dethroughtion (δX1, δY1) of the center of the inner-frame mark 27A and the amount of positional dethroughtion (δX2, δY2) of the center of the inner-frame mark 27C are measured. Then, adjusting the position of the coma correction optical system 16 and measuring the amount of positional dethroughtion are repeated until the amount of dethroughtion (δX, δY) which is acquired by substituting those measured values into the equations (22A) and (22B) falls within a predetermined allowable range. Through this, the adjustment of the coma which is the main contributor to the asymmetrical aberration of the detecting optical system is completed.

A description will now be given of the adjusting method for the illumination system in FIG. 1. For this, first, two pairs of marks 25X and 26X along the X axis on the wafer 11A for adjustment in FIG. 5 are used. Then, the centers of one pair of marks 25X are moved close to the center of the observation field of the position detecting apparatus in FIG. 1.

Figure 7A:
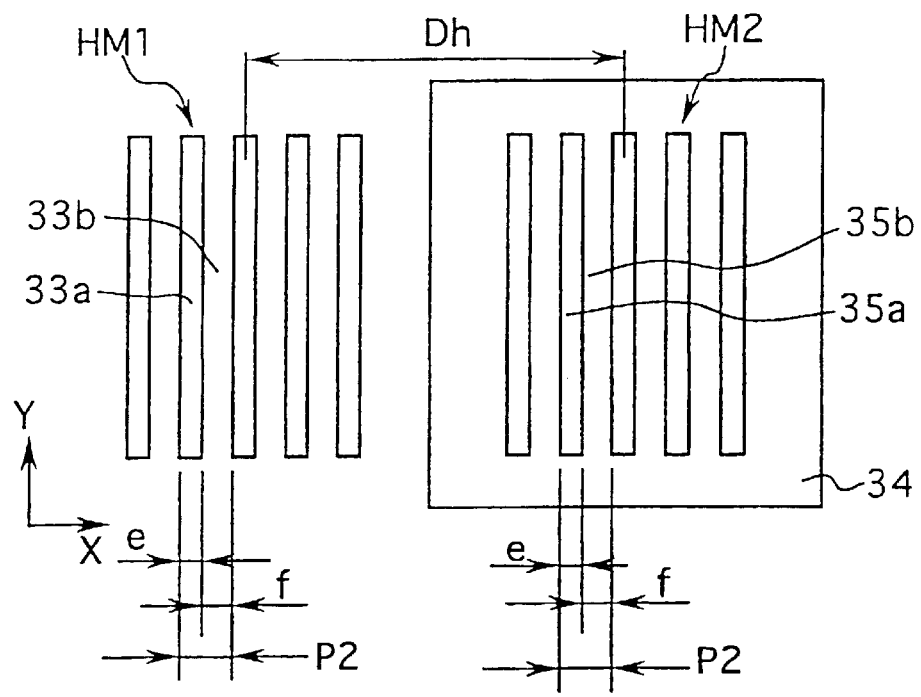
FIG. 7A is a front view of marks for adjusting the characteristics of the detecting optical system in FIG. 5.
Figure 7B:
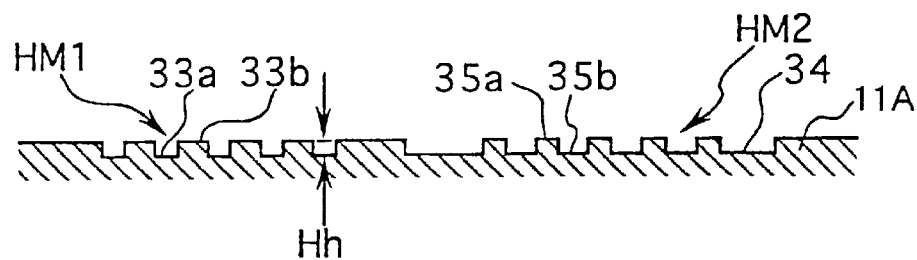
FIG. 7B is a cross-sectional view of marks for adjusting the characteristics of the detecting optical system in FIG. 5.

FIG. 7A is an enlarged plan view illustrating one pair of marks 25X, i.e., the marks HM1 and HM2, in FIG. 5 and FIG. 7B is a cross-sectional view of FIG. 7A in which the first mark HM1 has five elongated linear recessed patterns 33a with a line width e formed on the surface of the wafer 11A at a pitch P2 in a lattice form in the X direction with a predetermined step Hd, the pitch P2 being about 5 to 20 μm. Likewise, the second mark HM2 has its periphery surrounded by an engraved portion 34 and has five elongated linear protruding patterns 35a with the line width e formed at the pitch P2 in a lattice form.

The designed value of the distance between the centers of both marks HM1 and HM2 in the X direction is Dh and is about 50 to 100 μm. In this case, the first mark HM1 has the recessed patterns 33a having the width e and protruding patterns 33b having a width f (=P2−e), and the second mark HM2 has the protruding patterns 35a having the width e and recessed patterns 35b having the width f, and both marks HM1 and HM2 have the relationship between recesses and protrusions reversed. That is, the duty ratio of the recessed patterns 33a of the first mark HM1 is set equal to the duty ratio of the protruding patterns 35a of the second mark HM2.

It is desirable that the step Hh of the marks MH1 and MH2 should be about 40 to 100 nm. The reason for this is to acquire an image signal with good contrast. Further, to acquire the image signal with better contrast, it is desirable that the step Hh should be about 40 to 60 nm.

It is desirable that the duty ratio of the recessed patterns 33a of the first mark HM1 (100×e/P2 (%)) and the duty ratio of the protruding patterns 35a of the second mark HM2 (100×e/P2 (%)) should be approximately 10%. This is because, if the duty ratio is too small, the contrast of the mark images drops, thus deteriorating the reproducibility of the position detecting results. If the duty ratio is too large, the amount of change in the amount of dethroughtion of the relative position of the images of the recessed patterns 33a of the first mark HM1 and the images of the protruding patterns 35a of the second mark HM2, which is caused by the shift of the σ stop 3 (by an adjustment error of the illumination system), becomes smaller, thus reducing the adjustment sensitivity.

Figure 7C:
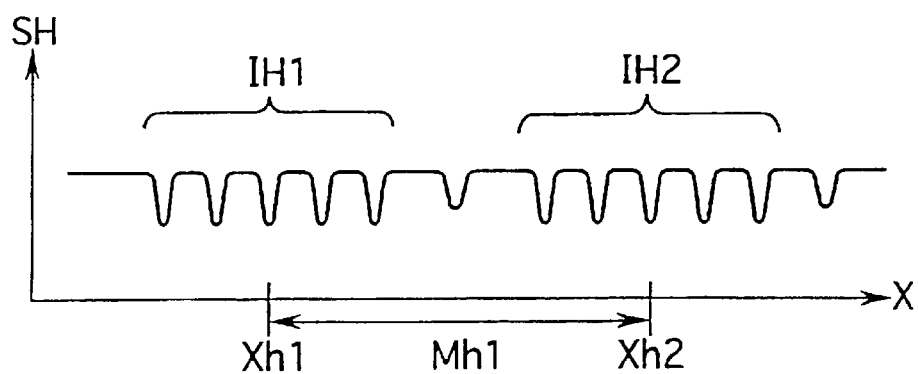
FIG. 7C is an image signal obtained from the images of the marks.

In the case where the two marks HM1 and HM2 arranged close to each other in such a mariner are observed by the position detecting apparatus in FIG. 1, an image signal obtained by reading their images in the X direction by the image pickup device 22 (or the signal averaged in the non-measuring direction) is the image signal SH in FIG. 7C. In the image signal SH in FIG. 7C, mark portions at portions IH1 and IH2 corresponding to the first mark HM1 and the second mark HM2 become dark portions. The control operation system 23 in FIG. 1 detects a position Xh1 of the center of the portion IH1 of the image signal SH and a position Xh2 of the center of the portion IH2 and acquires a distance Mh between them. The distance Mh takes a value which is obtained by multiplying the distance on the image pickup surface by 1/α by using a magnification factor α from the surface of the wafer 11A in FIG. 1 to the image pickup surface.

Next, the other pair of marks 26X along the X axis in FIG. 5 are moved near the center of the observation field of the position detecting apparatus in FIG. 1, and the image signal from the image pickup device 22 is processed as in the case of FIG. 7 to acquire the distance Mh2 which is the X-direction distance between the center of the image of the third mark HM3 and the center of the image of the fourth mark HM4 in terms of the length on the wafer 11A.

Then, the control operation system 23 in FIG. 1 computes the amount of dethroughtion δMX of the measured value of the distance between the two pairs of marks 25X, 26X from the ideal state as follows. This amount of dethroughtion δMX is equivalent to a part of the TIS (Tool Induced Shift) of the illumination system of the position detecting apparatus in FIG. 1.

$$\delta MX = (Mh1 - Mh2)/2 \tag{23}$$

Without an adjustment error in the illumination system, the amount of dethroughtion δMX obtained in the above manner should become nearly zero. With an adjustment error remaining in the illumination system, however, the amount of shifts of the images of the two marks HM1 and HM2 to be observed become different depending on the steps of the individual marks, so that the amount of dethroughtion δMX to be measured becomes greater than the allowable range.

Specifically, according to this embodiment, the sign and size of the amount of dethroughtion δMX change in accordance with the position of the σ stop 3 of the illumination system in FIG. 1. Therefore, the control operation system 23 in FIG. 1 adjusts the position of the σ stop 3 through the σ-stop position adjusting mechanisms 5a and 5b in such a way as to make the absolute value of the amount of dethroughtion δMX smaller. Thereafter, the distances Mh1, Mh2 of the images of the two sets of marks 25X, 26X are measured again, the amount of dethroughtion δMX is acquired by substituting the measured values into the equation (23), and the adjustment of the position of the σ stop 3 is completed by repeating the distance measurement and the adjustment of the position of the σ stop 3 until the amount of dethroughtion δMX falls within the allowable range.

As in the case of the aforementioned adjustment associated with the X direction, the adjustment of an adjustment error of the illumination system associated with the Y direction can also be performed by measuring the distances between the images of the two pairs of marks 25Y, 26Y along the Y axis on the wafer 11A in FIG. 5 and acquiring the difference between those distances.

The positional adjustment of the coma correction optical system 16 in FIG. 1 and the positional adjustment of the σ stop 3 in the above-described embodiment may be carried out independently. It is to be noted that at the time of adjusting the position of the σ stop 3, even if a coma remains in the detecting optical system (image-forming optical system), adjustment is possible without being affected by the coma. It is therefore efficient to adjust the coma by adjusting the position of the σ stop 3 first and then moving the coma correction optical system 16.

Although the remaining coma is adjusted and removed by adjusting the coma correction optical system 16 in FIG. 1 in this embodiment, this is not restrictive but the remaining coma and/or other aberrations (particularly, asymmetrical aberration) may be adjusted and removed by adjusting the positions or rotational angles of other optical members, such as the objective lenses 10 and the half prism 9. Further, at the time of adjusting the illumination state, not only the position of the σ stop 3 but also the position of the light source 1 or the position or the rotational angle of the first release lens 6 or the second release 8 may be adjusted.

Another example of to-be-detected marks that can be used at the time of adjusting the detecting optical system and the illumination system will now be discussed with reference to FIGS. 8 to 10.

FIG. 8A shows a pair of marks with a rotational angle of 0° formed in the vicinity of the two pairs of marks 25A, 26X along the X axis in FIG. 5. In FIG. 8A, one set of marks 25XA and 26X respectively have the same shapes and the same positional relationship as the marks 25X and 26X in FIG. 5, and in the vicinity of those marks, one set of marks 25XB (marks with a rotational angle of 0°) which consists of a fifth mark HM5 and a sixth mark HM6 having the same shapes and the same positional relationship as the first mark HM1 and the second mark HM2 are formed. In this example, after the distance Mh1 in the left-end marks 25XA and the distance Mh2 in the center marks 26X are simultaneously measured in the observation field of the position detecting apparatus in FIG. 1, for example, and the amount of dethroughtion δMX (which is δMX1) is acquired from the equation (23), a distance Mh3 in the right-end marks 25XB and the distance Mh2 in the center marks 26X are simultaneously measured in the observation field, and the amount of dethroughtion δMX (which is δMX2) is acquired by substituting Mh3 in place of Mh1 in the equation (23). The effect of variations in the results of detection in the observation field can be reduced by, for example, taking the averaged amount of dethroughtion of the amounts of dethroughtion δMX1 and δMX2 as a new amount of dethroughtion δMx.

In this example, the three pairs of marks 25XA, 26X and 25XB may be arranged shifted in the non-measuring direction (Y direction) as shown in FIG. 8B.

Figure 9:
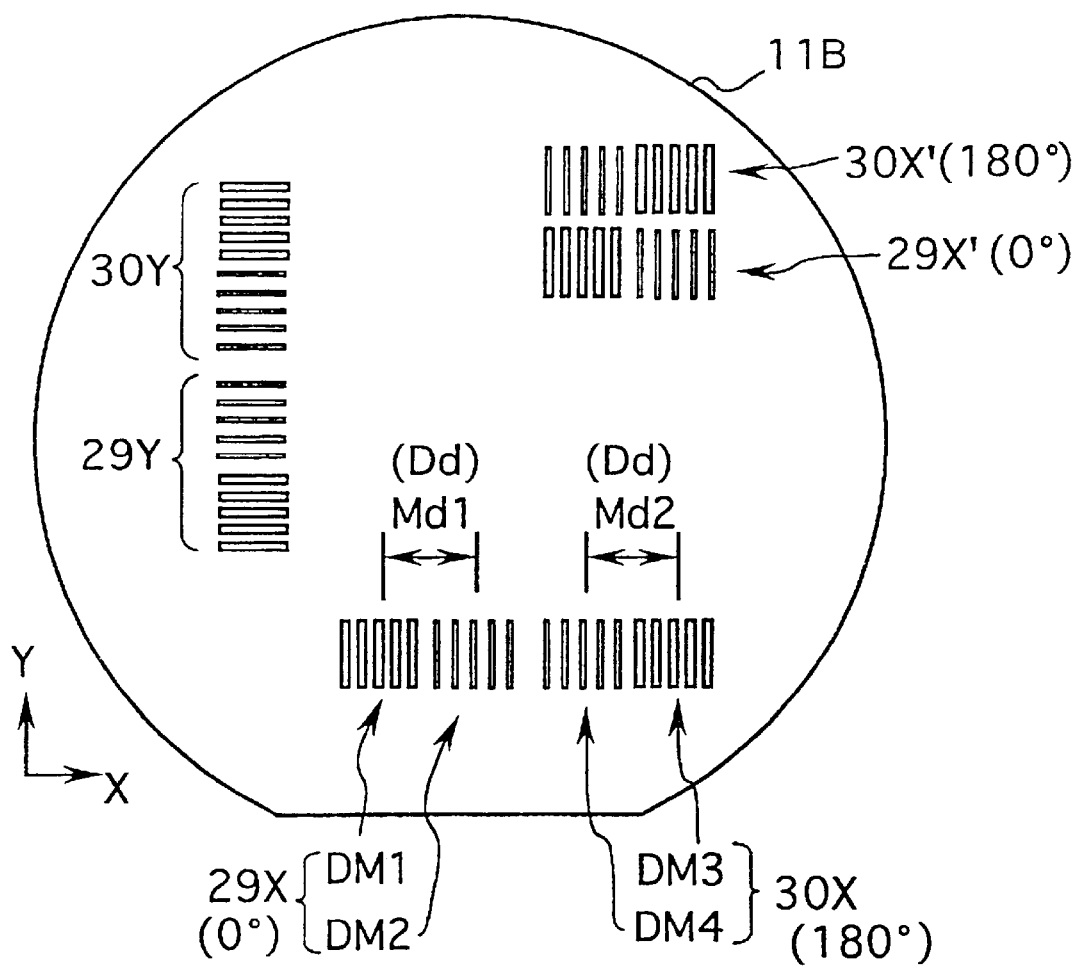
FIG. 9 is a plan view showing plural pairs of to-be-detected marks on another wafer which can be used for adjustment in the second embodiment.

FIG. 9 shows suitable marks for use in adjusting the asymmetrical aberration of, for example, the detecting optical system. In FIG. 9, formed on the surface of a wafer 11B for adjustment are a pair of marks 29X consisting of a first mark DM1 and a second mark DM2 each having a pattern of cyclic recesses and projections in the X direction and laid in series to each other, and a pair of marks 30X which have the shapes of the marks 29X rotated by 180° and are located in the vicinity of the pair of marks 29X. That is, given that the distance (designed value) between the first mark DM1 and second mark DM2 in the X direction is Dd, the pair of marks 30X consist of a third mark DM3 and fourth mark DM4 which have the same shapes as the marks DM1 and DM2 and the distance (designed value) between which is Dd.

Further formed are two pairs of marks 29Y and 30Y along the Y axis which have the shapes of the two pairs of marks 29X and 30X rotated by 90°. In this example too, two pairs of marks 29X' and 30X' along the X axis may be arranged in the Y direction instead of arranging the two pairs of marks 29X and 30X along the X axis in the X direction.

In this example too, the pair of marks 29X along the X axis in FIG. 9 are moved into the observation field of the position detecting apparatus in FIG. 1.

Figure 10A:
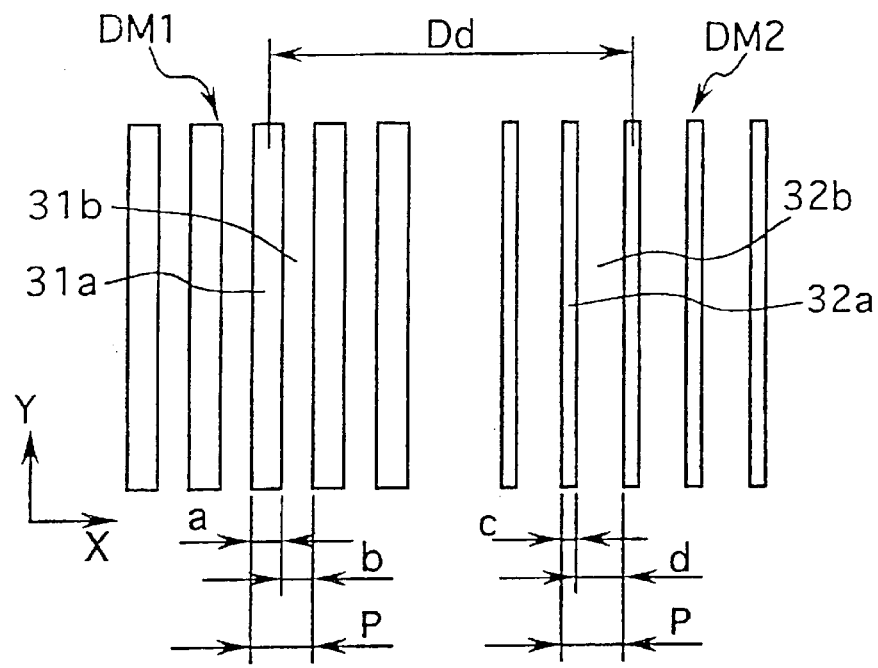
FIG. 10A is a front view of marks 29X in FIG. 9.
Figure 10B:
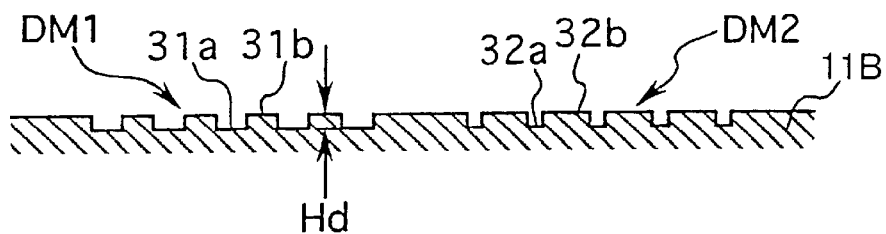
FIG. 10B is a cross-sectional view of marks 29X in FIG. 9.

FIG. 10A is an enlarged plan view illustrating one pair of marks 29X along the X axis shown in FIG. 9, and FIG. 10B is a cross-sectional view of FIG. 10A in which the first mark DM1 has five elongated linear recessed patterns 31a with a line width a formed on the surface of the wafer 11B at a pitch P in a lattice form in the X direction with a predetermined step Hd, the pitch P being about 5 to 20 μm. Likewise, the second mark DM2 has five elongated linear recessed patterns 32a with a line width c formed on the surface of the wafer 11B at the same pitch P in a lattice form in the X direction with the step Hd. In the X direction which is the measuring direction, the distance between the center of the first mark DM1 and the center of the second mark DM2 is set to a designed value of Dd. This distance Dd is approximately 50 to 100 μm.

It is desirable that the step (depth) Hd of each mark DM1, DM2 should be set to approximately 40 to 100 nm. If this step Hd is too small, the contrast of the images of those marks drops (the mark portions do not become sufficiently dark), lowering the position detecting precision. If this step Hd becomes greater than about 100 nm, geometrical step-induced adverse optical effects, such as vignetting, occurs, making it difficult to get highly accurate measurements. Further, to obtain an image with excellent contrast for each mark, it is desirable that the step be 40 to 60 nm.

In this embodiment, the ratio (a:b or a/b) of the width a of the recessed patterns 31a of the first mark DM1 to a width b of protruding patterns 31b (a+b=P) differs from the ratio (c:d or c/d) of the width c of the recessed patterns 32a of the second mark DM2 to a width d of protruding patterns 32b (c+d=P). In other words, the duty ratio (100×a/P (%)) of the width a of the recessed patterns 31a of the first mark DM1 with respect to the pitch P differs from the duty ratio (100×c/P (%)) of the width c of the recessed patterns 32a of the second mark DM2 with respect to the pitch P. As one example, the duty ratio of the recessed patterns 31a of the first mark DM1 is set to 50% and the ratio of the width a of the recessed patterns 31a to the width b of the protruding patterns 31b is set as follows in this embodiment.

$$a:b=1:1, \text{ or } a/b=1 \quad (24)$$

The duty ratio of the recessed patterns 32a of the second mark DM2 is set to about 10% and the ratio of the width c of the recessed patterns 32a to the width d of the protruding patterns 32b is about set as follows.

$$c:d=1:9, \text{ or } c/d=1/9 \qquad (25)$$

Figure 10C:
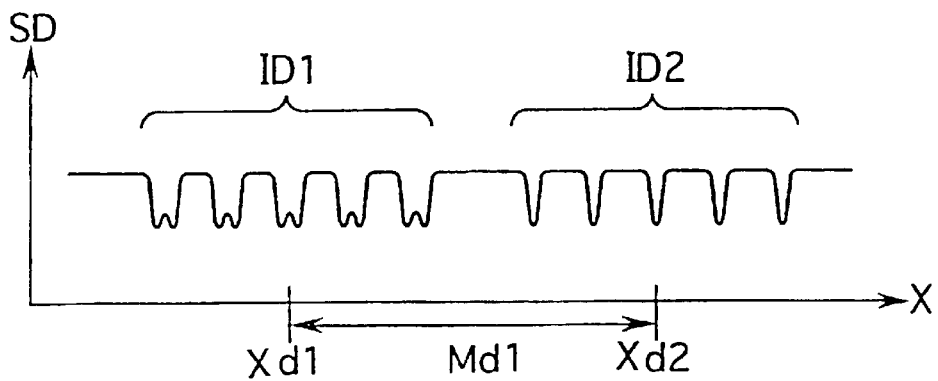
FIG. 10C is an image signal obtained from the images of the marks 29X in FIG. 9.

In the case where the two marks DM1 and DM2 arranged close to each other in the X direction in the above manner are observed by the position detecting apparatus in FIG. 1, an image signal obtained by reading their images in the X direction by the image pickup device 22 is an image signal SD in FIG. 10C. This image signal SD may be acquired by averaging an image signal, obtained by scanning the images of the two marks in FIG. 10A in the X direction, in the non-measuring direction (Y direction).

In FIG. 10C, the horizontal axis represents a position X in the measuring direction, and the position X actually represents a position which is obtained by multiplying the position from a predetermined reference point on the image pickup surface of the image pickup device 22 in FIG. 1 by $1/\alpha$ by using a magnification factor a from the surface of the wafer 11A in FIG. 9 to the image pickup surface of the image pickup device 22. In the image signal SD in FIG. 10C, the edge portion of the first mark DM1 becomes a dark portion at a portion ID1 corresponding to the image of the first mark DM1 and the edge portion likewise becomes a dark portion at a portion ID2 corresponding to the image of the second mark DM2.

The control operation system 23 in FIG. 1 acquires a distance Md between the center position Xd1 of the portion ID1 and the center position Xd2 of the portion ID2 from the image signal SD. With no aberration present in the detecting optical system, this distance Md should become the designed distance Dd in FIG. 10A. If a coma remains in the detecting optical system, however, the amount of change in the image position caused by the coma differs due to a difference between the duty ratios of the widths of the recessed patterns 31a and 32a of both marks DM1 and DM2, so that the distance Md1 does not coincide with Dd.

Next, the other pair of marks 30X along the X axis in FIG. 9 is moved into the observation field of the position detecting apparatus in FIG. 1, and the distance which is the distance between the images of the marks DM3 and DM4 in terms of the length on the wafer is acquired. Thereafter, the coma is adjusted by adjusting the position of the coma correction optical system 16 in FIG. 1 in such a way that the two distances Md1 and Md2 coincide with each other within a predetermined allowable range. Likewise, the coma in the Y-axial direction is adjusted.

Although marks rotated by 180° are formed beforehand on the wafer for adjustment in the above-described embodiment, another pair of marks which are a pair of marks rotated by a predetermined angle θ (0°<θ<360°) may be formed on the wafer beforehand and the distance or the like between those two pairs of marks may be measured.

Further, depending on the type of aberration to be measured, for example, a pair of first marks, a pair of second marks which are the pair of first marks rotated by 180°, a pair of third marks which are the pair of first marks rotated by 45°, and a pair of fourth marks which are the pair of third marks rotated by 180° may be formed on the wafer beforehand and the image-forming optical system and the illumination system may be adjusted by also using the distances that are detected with the pair of third marks and the pair of fourth marks. At this time, a pair of fifth marks which are the pair of first marks rotated by 135°, and a pair of sixth marks which are the pair of fifth marks rotated by 180° may further be formed on the wafer. With regard to the optical characteristics to be measured, the characteristics of the individual components in the sagittal direction (S direction) and in the meridional direction (M direction) can be detected by using the pair of third marks to the pair of sixth marks of those four sets.

Although a pair of first marks and a pair of second marks which are the pair of first marks rotated by a predetermined angle (e.g., 180°), for example, are formed on the wafer in the above-described embodiment, the relative rotational angle between the pair of first marks and the pair of second marks, i.e., the actual remaining rotational error of the pair of second marks (in the layout direction) with respect to second marks (in the layout direction) on the design in the case where the pair of first marks are accurately rotated by the predetermined angle, may be measured beforehand. When the measured remaining rotational error (the difference between the actual rotational angle and the predetermined angle) is greater than a predetermined value, the distance that is detected with, for example, the pair of second marks may be corrected in accordance with the remaining rotational error. This can provide the distance between the pair of second marks that are the pair of first marks as a reference rotated accurately by a predetermined angle.

Although marks for adjustment are formed on the wafer for adjustment in the above-described embodiment, those marks may be formed on a reference plate, such as the XY stage.

[Third Embodiment]

The third embodiment of this invention will now be described with reference to FIGS. 1 and 11 to 16. As a target to be adjusted in this embodiment is also the position detecting apparatus in FIG. 1, the description of the structure of the apparatus will be omitted and only the method for adjusting its optical system will be discussed. In this embodiment, a wafer 11C is placed in place of the wafer 11 for adjustment in FIG. 1. A plurality of marks for evaluation (step marks) are formed on the surface of this wafer 11C. To begin with, the evaluation marks comprised of plural sets of recessed and protruding lattice marks (step marks) formed on the wafer 11C for adjustment of this embodiment will be discussed.

Figure 11:
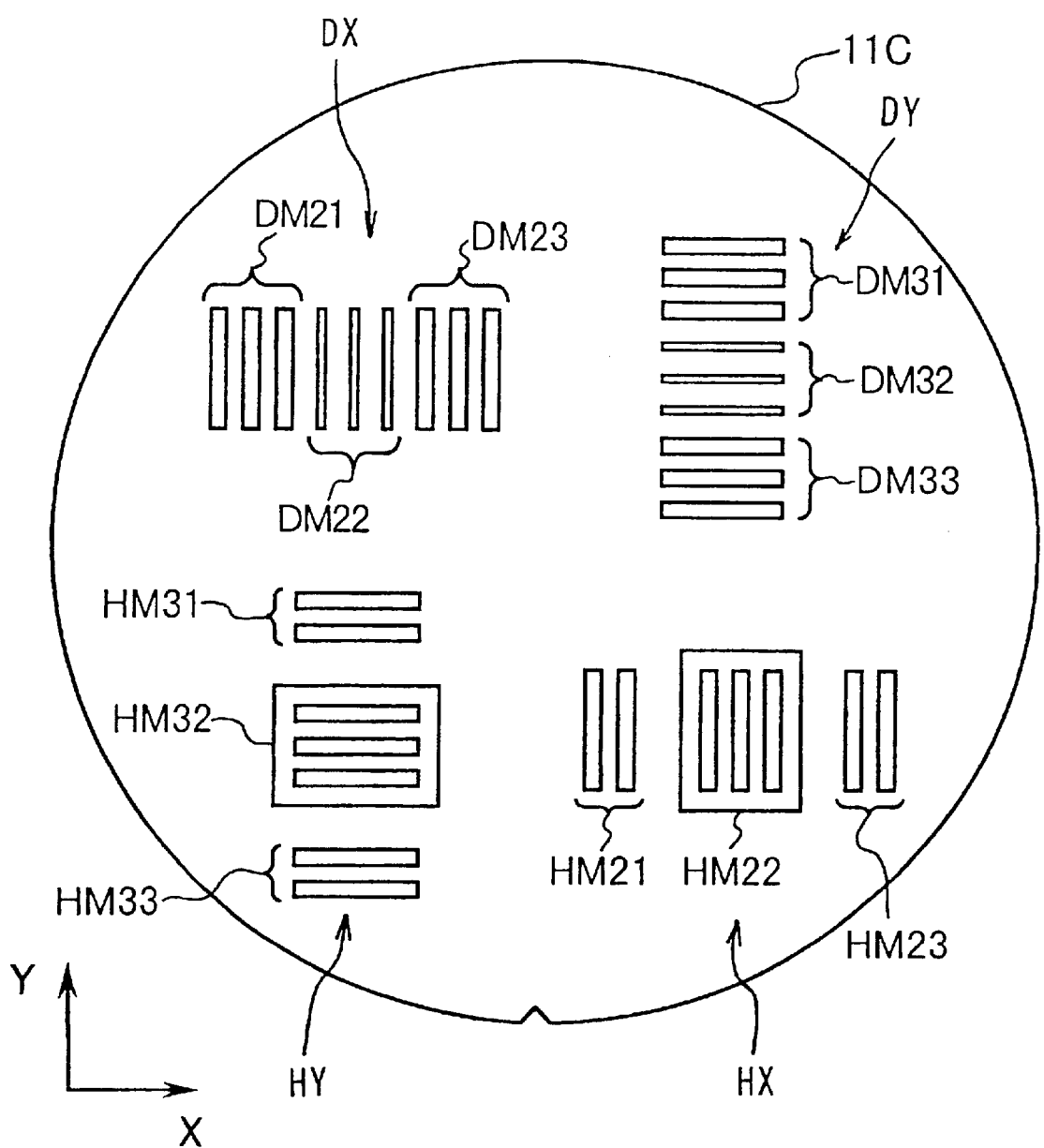
FIG. 11 is a plan view showing a plurality of evaluation marks on a wafer which can be used for adjustment in the third embodiment of this invention.

FIG. 11 is a plan view showing the wafer 11C for adjustment which is placed in place of the wafer 11 in FIG. 1, and a silicon wafer is used as one example of the wafer 11C in this FIG. 11. Formed on the surface of the wafer 11C are a first evaluation mark DX along the X axis consisting of a first mark DM21 to a third mark DM23 each having cyclic recessed and protruding patterns in the X direction and a first evaluation mark DY along the Y axis which consists of a first mark DM31 to a third mark DM33 and which has the shape of the evaluation mark DX rotated by 90°. The evaluation mark DX along the X axis is substantially line symmetrical in the measuring direction with the marks DM21 and DM23 having different ratios of the widths of the recessed portions and protruding portions located on both sides of the center mark DM22, and the evaluation marks DX and DY are used for adjusting the characteristics of the detecting optical system.

Also formed on the surface of the wafer 11C are a second evaluation mark HX along the X axis consisting of a first mark HM21 to a third mark HM23 each having cyclic recessed and protruding patterns in the X direction and a second evaluation mark HY which consists of a first mark HM31 to a third mark HM33 and which has the shape of the evaluation mark HX rotated by 90°. The evaluation mark HX along the X axis is substantially line symmetrical in the measuring direction with the marks HM21 and HM23 having reversed patterns of the recessed portions and protruding portions located on both sides of the center mark HM22, and the evaluation marks HX and HY are used for adjusting the characteristics of the illumination system.

When, for example, a silicon wafer is used as the wafer 11C, those recessed and protruding lattice marks can be formed with a very high accuracy through steps, such as application of a photoresist onto this wafer, exposure of the projection image of the corresponding reticle pattern, developing of the photoresist, etching and resist separation.

Figure 12A:
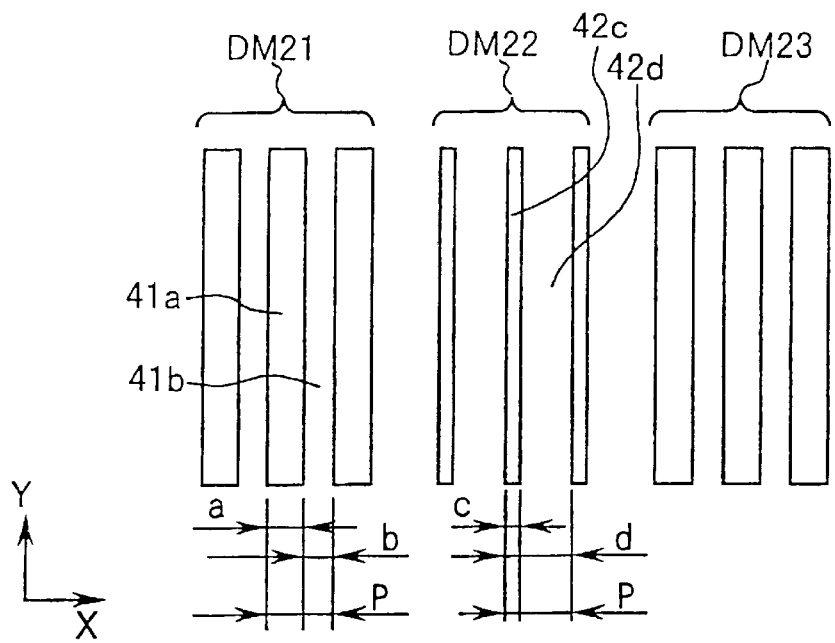
FIG. 12A is a front view of marks for adjusting the characteristics of the detecting optical system in FIG. 11.
Figure 12B:
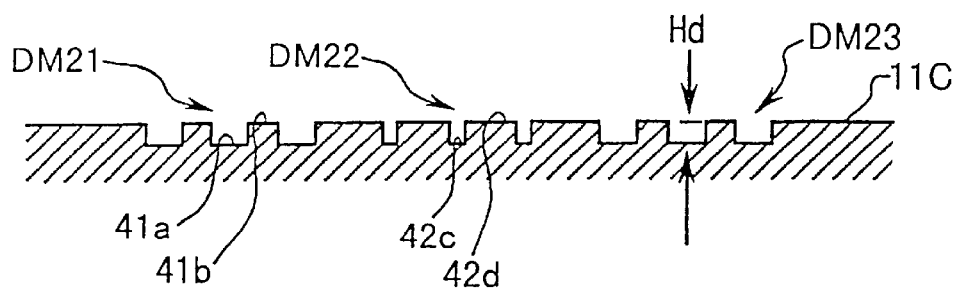
FIG. 12B is a cross-sectional view of marks for adjusting the characteristics of the detecting optical system in FIG. 11.

FIG. 12A is an enlarged plan view illustrating the first evaluation mark DX along the X axis shown in FIG. 11 and FIG. 12B is a cross-sectional view of FIG. 12A in which the center mark DM22 has three elongated linear recessed patterns 42c with a line width c formed on the surface of the wafer 11C at a pitch P in a lattice form in the X direction with a predetermined step Hd, the pitch P being about 5 to 20 μm. The marks DM21 and DM23 are so formed as to sandwich the mark DM22. Likewise, the mark DM21 has three elongated linear recessed patterns 41a with a line width a formed on the surface of the wafer 11C at the same pitch P in a lattice form in the X direction with the step Hd. The shape of the mark DM23 is the same as that of the mark DM21.

In the measuring direction (X direction), the distance between the center of the mark DM21 and the center of the mark DM22 and the distance between the center of the mark DM22 and the center of the mark DM23 are set to a designed value of Dd. This distance Dd is approximately 40 to 60 μm. Accordingly, the center of the mark DM22 on the design should coincide with the centers of the marks DM21 and DM23 on both sides in the measuring direction.

It is desirable that the step (depth) Hd of each of the marks DM21 to DM23 should be set to approximately 50 to 100 nm. If this step Hd is too small, the contrast of the images of those marks drops (the mark portions do not become sufficiently dark), lowering the position detecting precision. If this step Hd becomes greater than about 100 nm, step-induced adverse geometrical optic effects, such as vignetting, occur, making it difficult to get highly accurate measurements.

In this embodiment, the ratio (a:b or a/b) of the width a of the recessed patterns 41a of the mark DM21 (like the mark DM23 on the other end) to a width b of protruding patterns 41b (a+b=P) differs from the ratio (c:d or c/d) of the width c of the recessed patterns 42c of the center mark DM22 to a width d of protruding patterns 42d (c+d=P). As one example, the width a of the recessed patterns of the marks DM21 and DM23 is set to 10% of the pitch P and the ratio of the width a of the recessed patterns to the width b of the protruding patterns is set as follows.

$$a:b=1:1, \text{ or } a/b=1 \tag{31}$$

The width c of the recessed patterns of the center mark DM22 is set to about 10% of the pitch P and the ratio of the width c of the recessed patterns to the width d of the protruding patterns is nearly set as follows.

$$c:d=1:9, \text{ or } c/d=1/9 \tag{32}$$

Figure 12C:
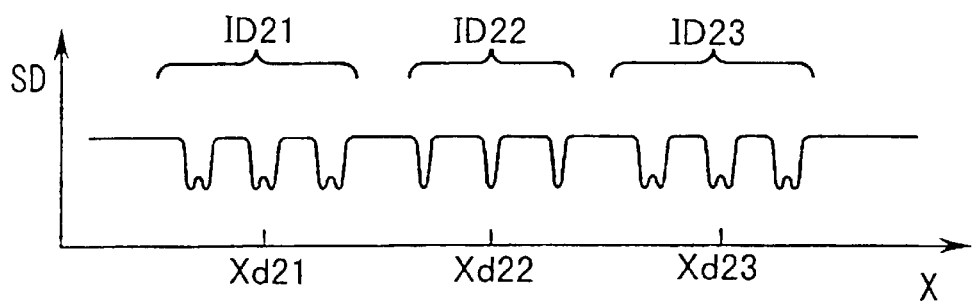
FIG. 12C is an image signal obtained from the images of the marks.

In the case where the evaluation mark consisting of the three marks DM21, DM22 and DM23 arranged close to each other in the X direction in the above manner is observed by the position detecting apparatus in FIG. 1, an image signal obtained by reading their images in the X direction by the image pickup device 22 is an image signal SD in FIG. 12C. This image signal SD may be acquired by averaging an image signal, obtained by scanning the images of the two marks in FIG. 12A in the X direction, in the non-measuring direction (Y direction).

In FIG. 12C, the horizontal axis represents a position X in the measuring direction, and the position X actually represents a position which is obtained by multiplying the position from a predetermined reference point on the image pickup surface of the image pickup device 22 by 1/αby using a magnification factor α from the surface of the wafer 11C in FIG. 1 to the image pickup surface of the image pickup device 22. In the image signal SD in FIG. 12C, the edge portions of portions ID21 and ID23 corresponding to the images of the marks DM21 and DM23 at both ends become dark portions, and a portion ID22 corresponding to the image of the center mark DM22 becomes a dark portion at a portion corresponding to the recessed pattern with the narrow width c.

The control operation system 23 in FIG. 1 acquires center positions Xd21, Xd22 and Xd23 of the portions ID21, ID22 and ID23 as the positions of the individual marks from the image signal SD, and then computes the average position Xd24 of the marks at both ends as follows.

$$Xd24=(Xd21+Xd23)/2 \tag{33}$$

Then, the control operation system 23 computes a dethroughtion Md (=Xd22−Xd24) of the average position Xd 24 of the marks DM21 and DM23 at both ends with respect to the position Xd22 of the center mark DM22 of the evaluation mark as a relative positional relation.

With no aberration present in the detecting optical system, the dethroughtion Md should be a predetermined, preacquired reference value D0 (0 on the design). If a coma remains in the detecting optical system, however, the amount of change in the image position caused by the coma differs due to a difference between the duty ratios of the mark 22 and the marks DM21 and DM23 (the ratio of the widths c and a of the recessed patterns with respect to the pitch P), so that the measured dethroughtion Md does not coincide with the reference value D0. Because it is possible to determine not only the level of the remaining coma but also the sign from the size relationship between the measured dethroughtion Md and the reference value D0, the control operation system 23 in FIG. 1 adjusts the position of the coma correction optical system 16 through the coma-correction-optical-system position adjusting mechanisms 17a and 17b in such a way as to make the error ΔMd smaller based on the sign and size of an error ΔMd (=D0−Md) of the dethroughtion Md with respect to the reference value D0.

After the adjustment of the position of the coma correction optical system 16, the dethroughtion Md between the position of the center mark DM22 and the average position of the marks DM21, DM23 at both ends is measured again, and the error ΔMd of this dethroughtion Md with respect to the reference value D0 is computed. If this error ΔMd is beyond the allowable range, the aforementioned adjustment is carried out again. As the above-described steps are repeated until the error ΔMd falls within the allowable range, and the adjustment of the coma of the detecting optical system is completed. Because the adjusting method of this embodiment measures the distance between the marks with different duty ratios, as per the first embodiment, it will be called "different ratio mark method".

There are various methods, such as the slice method and correlation method, for the algorithm of detecting the position of each mark image in the above-described position detecting process, and any one of them may be used in this embodiment. For example, the slice method performs position detection based on the slice position of the image signal SD at a predetermined slice level and the correlation method compares the image signal SD with a predetermined reference waveform and takes the position with the highest degree of correlation with the reference waveform as the position of the mark image.

While the aforementioned reference value D0 should reach 0 because of the symmetry of the evaluation marks, the actual reference value D0 may not reach 0 due to a slight asymmetry of the evaluation marks due to a production error in the patterns of the reticles used at the time of transferring the evaluation marks or a production error, such as an etching error at the time of forming steps on the wafer 11C, and distortion or the like of the detecting optical system. Before the aforementioned adjustment, therefore, it is desirable to measure the actual value of the reference value D0. This can be readily accomplished by using the average value of the first measurement and the second measurement with the wafer 11C rotated 180°, as disclosed in the "document 1" referred to in the sections "Prior Art" and "First Embodiment".

Specifically, in this embodiment, after the dethroughtion of the average position of the marks DM21 and DM23 at both ends with respect to the position of the center mark DM22 in the X direction (the dethroughtion being Md1) is measured, the wafer 11C should be rotated 180° and the dethroughtion of the average position of the marks DM21 and DM23 at both ends with respect to the position of the center mark DM22 in the X direction (the dethroughtion being Md2) is measured again. Then, the average value of those two measured values should be used as the reference value D0.

$$D0=(Md1+Md2)/2 \tag{34}$$

Even if there is a remaining coma in the detecting optical system in FIG. 1, therefore, it is possible to detect, with a high precision, the error ΔMd of the dethroughtion Md of the centers of the marks at both ends with respect to the center mark produced by the coma.

It is to be noted that the method of measuring the reference value (true value) by rotating the wafer 11C causes the evaluation marks on the wafer 11C themselves to be turned 180°, so that if the evaluation marks do not have symmetry (line symmetry with respect to the center axis along the non-measuring direction (Y direction) perpendicular to the measuring direction), an error component originating from distortion or the like of the detecting optical system may be superimposed on the measured values of the positional relationships of the two marks before rotation and after 180° rotation. With regard to this point, according to this embodiment, the evaluation mark DX has symmetry as shown in FIG. 12, so that the symmetry of the evaluation mark DX is kept before rotation and after 180° rotation and the reference value D0 can be measured with a high precision with no error component originating from distortion or the like of the detecting optical system.

In general, a position detecting apparatus needs to measure the mark positions in the two directions (the X direction, Y direction) or the relative positional relationship. As in the case of the aforementioned adjustment associated with the X direction, adjustment of a coma associated with the Y direction can also be performed by detecting the positions of the images of the individual marks DM31 to DM33 of the first evaluation mark DY along the Y axis on the wafer 11C in FIG. 11 and measuring the dethroughtion of the centers of the images of the marks DM31 and DM33 at both ends with respect to the center of the image of the center mark DM22 as a relative positional relationship.

The adjusting method for the illumination system in FIG. 1 according to this embodiment will now be discussed. First, the second evaluation mark HX along the X axis on the wafer 11C for adjustment in FIG. 11 is used.

Figure 13A:
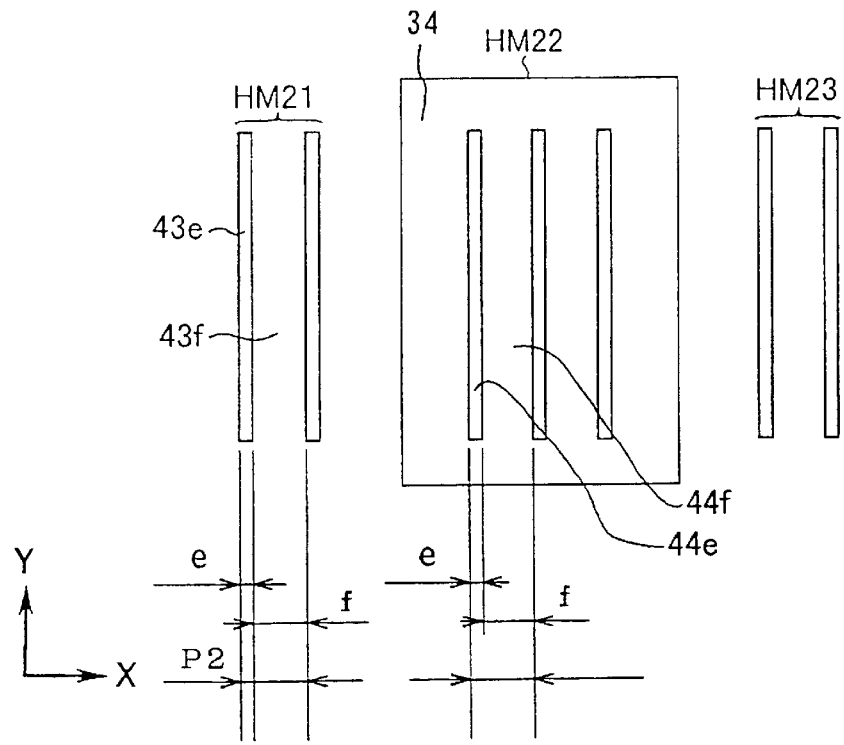
FIG. 13A is a front view of marks for adjusting the characteristics of the detecting optical system in FIG. 11.
Figure 13B:
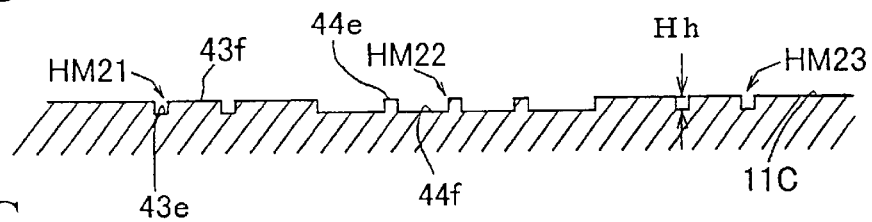
FIG. 13B is a cross-sectional view of marks for adjusting the characteristics of the detecting optical system in FIG. 11.

FIG. 13A is an enlarged plan view illustrating the first evaluation mark HX along the X axis shown in FIG. 11 and FIG. 13B is a cross-sectional view of FIG. 13A in which the center mark HM22 has its periphery surrounded by an engraved portion 34 and has three elongated linear protruding patterns 44e with a line width e formed at a pitch P2 in a lattice form in the X direction. The pitch P2 is about 5 to 20 μm.

The marks HM21 and HM23 of the same shape are so formed as to sandwich the mark HM22 in the X direction. The mark HM21 has two elongated linear recessed patterns 43e with the line width e formed on the surface of the wafer 11C at the pitch P2 in a lattice form in the X direction with a predetermined step Hh. That is, the mark HM21 at one end (like the other mark HM23) has the recessed patterns 43e having the width e and protruding patterns 43f having a width f (=P2−e), and the center mark HM22 has the protruding patterns 44e having the width e and recessed patterns 44f having the width f. The marks HM21 and HM23 at both ends and the center mark HM22 have only the relationship between the recesses and protrusions reversed. In other words, the duty ratio of the recessed patterns of the marks HM21 and HM23 at both ends is set equal to the duty ratio of the protruding patterns of the center mark HM22.

The width of the recessed patterns of the marks HM21 and HM23 at both ends, i.e., the width e of the protruding patterns of the center mark HM22 is set to about 5% to 10% of the pitch P2 of the marks as one example.

In the measuring direction (X direction), the distance between the center of the mark HM21 and the center of the mark HM22 and the distance between the center of the mark HM22 and the center of the mark HM23 are set to a designed value Dh. This distance Dh is approximately 40 to 60 μm. In this case too, the center of the mark HM22 on the design should coincide with the centers of the marks HM21 and HM23 on both sides in the measuring direction.

Figure 13C:
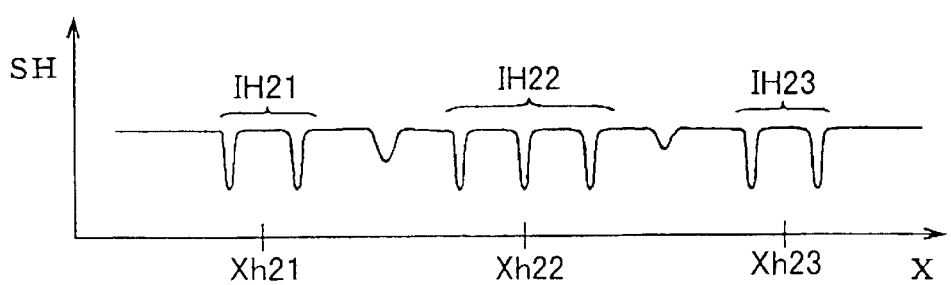
FIG. 13C is an image signal obtained from the images of the marks.

In the case where the three marks HM21, HM22 and HM23 arranged close to each other in such a manner are observed by the position detecting apparatus in FIG. 1, an image signal obtained by reading their images in the X direction by the image pickup device 22 (or the signal averaged in the non-measuring direction) is an image signal SH in FIG. 13C. If the width e in FIG. 13A is narrow, portions IH21 and IH23 in the image signal SH in FIG. 13C, which correspond to the marks HM21 and HM23 at both ends, become dark portions at the recessed pattern portions, and a portion IH22 corresponding to the center mark HM22 becomes a dark portion at the portion corresponding to the protruding pattern.

The control operation system 23 in FIG. 1 detects center positions Xh21, Xh22 and Xh23 of the portions IH21, IH22 and IH23 of the image signal SH and further computes an average position Xh24 (=(Xh21+Xh23)/2) of the marks at both ends. Next, a dethroughtion Mh of the center position Xh24 of the marks HM21 and HM23 at both ends with respect to the position Xh22 of the center mark HM22 is acquired as a relative positional relationship.

Without an adjustment error in the illumination system, the dethroughtion Mh obtained in the above manner should be equal to a predetermined reference distance H0 (it becomes 0 on the design). With an adjustment error in the illumination system, however, the amounts of shifts of the images to be observed become different depending on the steps of the individual marks (recesses or protrusions), so that the dethroughtion Mh to be measured differs from the reference value H0.

Specifically, according to this embodiment, the sign and size of an error ΔMh (=H0−Mh) of the dethroughtion Mh with respect to the reference value H0 change greatly in accordance with the position of the σ stop 3 of the illumination system in FIG. 1. Therefore, the control operation system 23 in FIG. 1 adjusts the position of the σ stop 3 through the σ-stop position adjusting mechanisms 5a and 5b in such a way as to make the error ΔMh smaller. Thereafter, the error ΔMh of the dethroughtion Mh1 between the marks at both ends with respect to the center mark is measured again, and the adjustment of the position of the σ stop 3 is completed by adjusting the position of the σ stop 3 until the error ΔMh falls within the allowable range.

As such an adjusting method measures the positional relationship of marks with different steps, this method will be called "different step mark method" in this specification. The present inventor found that the use of the different step mark method, which is disclosed in the aforementioned document 1, can adjust the positional dethroughtion of the σ stop 3 or the uneven illuminance of the illumination light in the layout surface of the σ stop 3 with a high accuracy.

It is desirable that the step Hh of the marks MH21, HM22 and MH23 should also be about 30 to 60 nm. The smaller (the lower) this step Hh is in its range or in a lower range, the greater the change in the to-be-detected positional relationship of the individual marks which is caused by the positional dethroughtion or the like of the σ stop 3 appears. That is, the detection sensitivity becomes higher. Note however that if the step Hh of the marks is too small, the contrast of the mark images drops, lowering the SN ratio of the image signals, so that the measuring precision of the positional relationship drops. While it is desirable to set the mark step Hh in the aforementioned range, therefore, it goes without saying that the detection sensitivity is improved if marks with a lower step are used as long as the image pickup device of the detecting optical system to be used has a good SN ratio.

It is desirable that the width e of the recessed patterns of the marks HM21 and HM23 at both ends and the width e of the protruding patterns of the center mark HM22 should be approximately 10% of the pitch P2. This is because that if the duty ratio of the width e (the ratio to the pitch P2) is too small, the contrast of the mark images drops, thus deteriorating the reproducibility of the position detecting results. If the duty ratio is too large, the amount of a change in the amount of dethroughtion of the relative position of the images of the recessed patterns of the marks HM21 and HM23 at both ends and the images of the protruding patterns of the center mark HM22, which is caused by the displacement of the σ stop 3 (by an adjustment error of the illumination system), becomes smaller, thus reducing the adjustment sensitivity.

As in the case of the aforementioned adjustment associated with the X direction, adjustment of an adjustment error of the illumination system associated with the Y direction can also be performed by measuring the positional relationship of the image of the second evaluation mark HY along the Y axis on the wafer 11C in FIG. 11.

Further, it is desirable in the case of FIG. 13 to measure the actual value of the reference value H0 of the dethroughtion Mh of the marks HM21 and HM23 at both ends with respect to the center mark HM22. To accomplish this, as in the case of FIG. 12, after the dethroughtion of the marks HM21 and HM23 with respect to the mark HM22 in FIG. 13A (the dethroughtion being Mh1) is measured, the wafer 11C should be turned 180°, the dethroughtion of the marks HM21 and HM23 with respect to the mark HM22 (the dethroughtion being Mh2) should be measured again and an average value of those two measured values should be taken as the reference value H0.

As an evaluation mark, a mark with a different structure from that of each evaluation mark shown in FIGS. 12 and 13 may be used.

For example, in the example of FIG. 12, the width of the recessed portions of the center mark DM22 to the width of the protruding portions may be set to 1:1 and the marks DM21 and DM23 at both ends may be recessed marks whose duty ratio of the width of the recessed portions is about 5 to 10%. Further, marks (protruding marks) whose duty ratio of the width of the protruding portions is about 5 to 10% may be used instead of the marks whose duty ratio of the width of the recessed portions is about 5 to 10%.

Likewise, in the example of FIG. 13, the center mark HM22 may be a mark which has recessed portions having a narrow width (recessed mark) and the marks HM21 and HM23 at both ends may be marks which have protruding portions having a narrow width (protruding marks).

The number of the recessed patterns (or the protruding patterns) which constitute each mark DM21, DM22, DM23, HM21, HM22, HM23 may not be the number illustrated in FIGS. 12 and 13 but any number can be used. It is however desirable that the numbers of the recessed patterns (or protruding patterns) of the marks at both ends should be equal to each other. That is, it is desirable that the numbers of the recessed patterns constituting the marks DM21 and DM23 in FIG. 12 should be equal to each other, and the numbers of the recessed patterns constituting the marks HM21 and HM23 in FIG. 13 should be equal to each other.

The positional adjustment of the coma correction optical system 16 in FIG. 1 and the positional adjustment of the σ stop 3 in the above-described embodiment may be carried out independently. It is to be noted that at the time of adjusting the position of the σ stop 3, even if a coma remains in the detecting optical system (image-forming optical system), adjustment is possible without being influenced by the coma. It is therefore efficient to adjust the coma by adjusting the position of the σ stop 3 first and then moving the coma correction optical system 16.

Although the remaining coma is adjusted and removed by adjusting the coma correction optical system 16 in FIG. 1 in this embodiment, this is not restrictive but the remaining coma may be adjusted and removed by adjusting the positions or rotational angles of other optical members, such as the objective lenses 10 and the half prism 9. Further, at the time of adjusting the illumination state, not only the position of the σ stop 3 but also the position of the light source 1 or the position or the rotational angle of the first release lens 6 or the second release 8 may be adjusted.

A description will now be given of the position detecting apparatus in FIG. 1 as adapted to an alignment sensor of a projection aligner, with reference to FIGS. 14 and 15.

Figure 14:
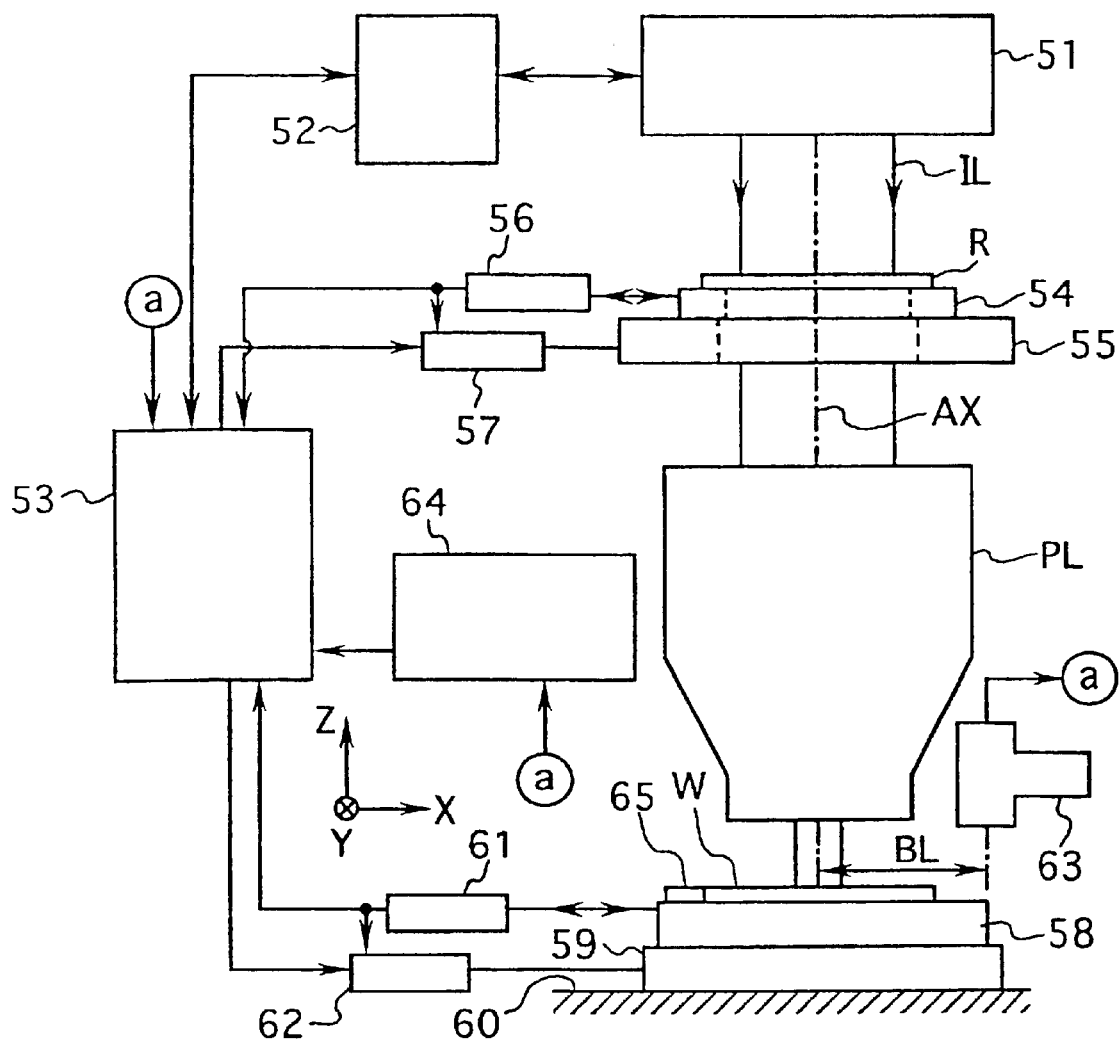
FIG. 14 is a structural diagram showing a projection aligner equipped with the position detecting apparatus in FIG. 1 as an alignment sensor.

FIG. 14 shows a projection aligner which is used in this embodiment. Referring to FIG. 14, at the time of exposure, exposure light IL is irradiated on a reticle R by an illumination optical system 51, which comprises an exposure light source, such as a mercury lamp or an excimer laser source, an optical integrator, a variable field stop, and a condenser lens system or the like. Then, the image of a pattern formed on the reticle R is projected on a single shot area, on a wafer W on which a photoresist is applied, through a projection optical system PL with a projection magnification β (β being 1/5, 1/4 or the like) through the projection optical system PL. At this time, an exposure amount control system 52 optimizes the exposure amount based on control information of a main control system 53.

A description will now be given with a Z axis set in parallel to the optical axis AX of the projection optical system PL, an X axis set in parallel to the sheet surface of FIG. 14 in a plane perpendicular to the Z axis and a Y axis set perpendicular to the sheet surface of FIG. 14. At this time, the reticle R is chucked on a reticle stage 54 and the reticle stage 54 positions the reticle R on a reticle base 55 in the X direction, the Y direction and the rotational direction based on control information of a drive system 57 based on the measured values of the coordinates of the reticle stage 54 by a laser interferometer 22.

The wafer W is held on a wafer holder (not shown) by a vacuum chuck, and the wafer holder is secured on a sample table 58 which is fixed onto an XY stage 59 supported on a fixed table 60 in such a way as to float through an air bearing. The sample table 58 controls the X-directional position (focus position) of the wafer W and the tilt angle to fit the surface of the wafer W into the image of the projection optical system PL in an auto-focus system, and the XY stage 59 moves the sample table 58 in a stepping manner in the X direction and Y direction based on control information of a drive system 62 based on the position of the sample table 58 which is measured by a laser interferometer 61. Exposure to the individual shot areas on the wafer W is carried out by repeating the step movement by the XY stage 59 and the exposure of the pattern image of the reticle R in the step and repeat system.

When overlying exposure is performed by the projection aligner in FIG. 14, alignment of the reticle R and the wafer W should be carried out beforehand prior to exposure. For that purpose, a reference mark member 65 on which various reference marks are formed is secured onto the sample table 65 and the reticle R is aligned with the reference mark member 65 based on the measurement results of a reticle alignment microscope (not shown). An alignment sensor 63 of an image processing type is arranged on the side of the projection optical system PL by the off-axis system having the same structure as the optical system of the position detecting apparatus in FIG. 1, and an image signal from the image pickup device 22 (see FIG. 1) in the alignment sensor 63 is supplied to an alignment signal processing system 64. The alignment signal processing system 64 has a function of acquiring the positional dethroughtion of the images of alignment marks on the wafer W to be detected with respect to index marks 14a and 14b in FIG. 1 in addition to the functions of the control operation system 23 in FIG. 1.

Because the image signal processing scheme or the like in the alignment signal processing system 64 is disclosed in, for example, Japanese Unexamined Patent Publication (KOKAI) No. Hei 4-65603 and its corresponding U.S. Pat. No. 5,493,403, its detailed description will be omitted. The disclosures in this publication and the U.S. patent are incorporated herein by reference as a part of the present description within what is permitted by the domestic laws of the country specified or selected in this international application.

Figure 15A:
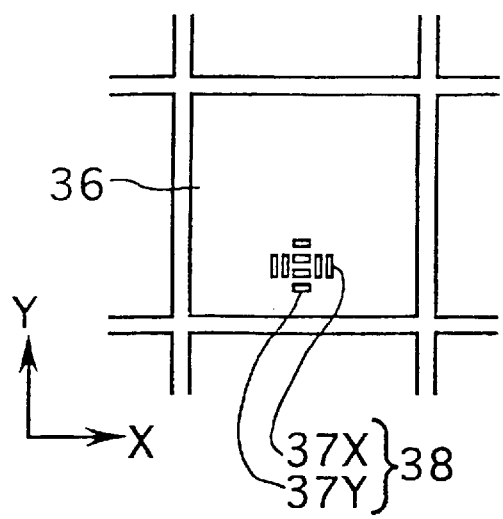
FIG. 15A is a plan view exemplifying a wafer mark to be detected by the alignment sensor in FIG. 14.
Figure 15B:
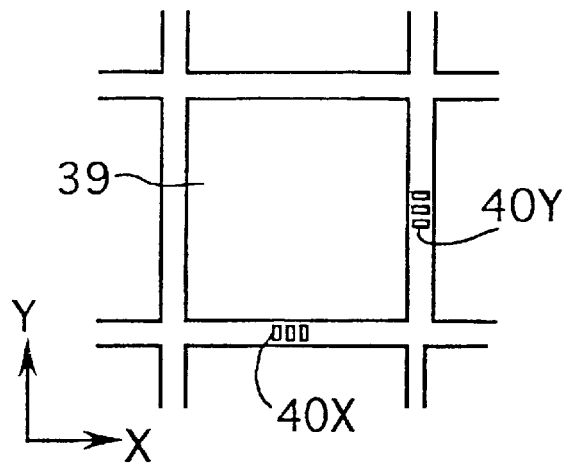
FIG. 15B is a plan view showing another example of the wafer mark to be detected by the alignment sensor.

As shown in FIG. 15A, a two dimensional wafer mark 38 for alignment is formed on each shot area 36 on the wafer W, and the wafer mark 38 comprises a wafer mark 37Y along the Y axis having recessed and protruding patterns formed in the Y direction at a given pitch and a wafer mark 37X along the X axis having recessed and protruding patterns formed in the X direction at a given pitch in such a way as to sandwich the wafer mark 37Y. Two or more wafer marks 38 may be formed in each shot area. Further, the wafer marks to be detected may be one-dimensional wafer marks 40X and 40Y independently provided in each shot area on the wafer, as shown in FIG. 15B. The former wafer mark 40X along the X axis has recessed and protruding patterns formed at a given pitch in the X direction, and the latter wafer mark 40Y along the Y axis has recessed and protruding patterns formed at a given pitch in the Y direction.

In the case where the alignment sensor 63 is used in FIG. 14, first, the wafer 11 for adjustment in FIG. 2 is placed on the sample table 58 through an unillustrated wafer loader system. Then, the distance between the images of two pairs of marks (HM1, HM2) and marks (HM11, HM12) for adjusting the characteristics of the illumination system in FIG. 2 is measured through the alignment sensor 63, and the position of the σ stop 3 in FIG. 1 is adjusted based on the measurement result. Then, the distance between the images of two pairs of marks (DM1, DM2) and marks (DM11, DM12) for adjusting the characteristics of the detecting optical system in FIG. 2 is measured through the alignment sensor 63, and the position of the coma correction optical system 16 in FIG. 1 is adjusted based on the measurement result.

Similar adjustment can be conducted by using the wafer 11C for adjustment in FIG. 11. In this case, the wafer 11C for adjustment in FIG. 11 is placed on the sample table 58 through the unillustrated wafer loader system. Then, the positional relationship of the images of two evaluation marks HX and HY for adjusting the characteristics of the illumination system in FIG. 11 is measured through the alignment sensor 63, and the position of the σ stop 3 in FIG. 1 is adjusted based on the measurement result. Then, the positional relationship of the images of two evaluation marks DX and DY for adjusting the characteristics of the detecting optical system in FIG. 11 should be measured through the alignment sensor 63, and the position of the coma correction optical system 16 in FIG. 1 should be adjusted based on the measurement result. Further, the adjustment of the illumination system can be executed by measuring the distance between the images of the marks 25X, 26X, 25Y and 26Y on the wafer 11A for adjustment in FIG. 5, and the adjustment of the detecting optical system can be executed by measuring the positional relationship of the images of the marks 28A and 28B on the wafer 11A in FIG. 5 or the distance between the images of the marks 29X, 30X, 29Y and 30Y on the wafer 11B in FIG. 9.

Thereafter, in FIG. 14, the distance (baseline amount) between the center position (exposure center) of the pattern image of the reticle R and the detection center of the alignment sensor 63 is acquired by detecting the position of a predetermined reference mark on the reference mark member 65 through the alignment sensor 63 in parallel to the alignment of the reticle R. Then, the XY stage 59 is driven based on the coordinates obtained by correcting the position of the wafer mark to be detected through the alignment sensor 63 with the baseline amount, thereby providing a high overlaying precision.

The structure of the reference mark member 65 and the reticle alignment and the measurement of the baseline amount, etc. are disclosed in, for example, Japanese Unexamined Patent Publication (KOKAI) No. Hei 4-324923 and its corresponding U.S. Pat. No. 5,243,195, and the disclosures in this publication and the U.S. patent are incorporated herein by reference as a part of the present description within what is permitted by the domestic laws of the country specified or selected in this international application.

The σ stop 3 and the aperture stop 18 shown in FIG. 1 may be so designed as to be respectively replaced with other stops. For example, a plurality of stops may be provided on a turret plate in, for example, each of the illumination system and the image-forming optical system, and one stop which is selected in accordance with the conditions (step amount, pitch, shape, etc.) for forming an alignment mark (e.g., the wafer mark 38) on the wafer W, the type of a layer (reflectance or the like) on the wafer W where an alignment mark is formed and the type and thickness of a resist may be disposed in the optical path. For example, the aperture stop 18 may be replaced with a stop for shielding the 0-th light (positive reflected light) generated from the wafer in order to detect the wafer mark 38 in the dark field system or the aperture stop 18 may be replaced with a retardation plate in order to provide functions similar to those of a retardation microscope. The σ stop 3 may be replaced with a stop having an annular opening at the same time as the aperture stop 18 is replaced or independently, so as to place the wafer mark 38 under annular illumination. With the thus constituted alignment sensor 63, when a stop is replaced in at least one of the illumination system and the image-forming optical system, it is desirable to load the wafer 11 shown in FIG. 2 onto the wafer stage 59 and adjust the illumination system or the image-forming optical system. Note that an alignment sensor which can permit replacement of the stop in the illumination system or the image-forming optical system is disclosed in, for example, Japanese Unexamined Patent Publication (KOKAI) No. Hei 8-306609 and Japanese Unexamined Patent Publication (KOKAI) No. Hei 8-327318 and their corresponding U.S. Pat. No. 5,706,091, and the disclosures in the publications and the U.S. patent are incorporated herein by reference as a part of the present description within what is permitted by the domestic laws of the country specified or selected in this international application.

To execute the optical adjustment that has been explained in the above-described individual embodiments, it is desirable to make the rotational error of a wafer with respect to the coordinate system of the wafer stage 59 (i.e., the orthogonal coordinate system defmed by the interferometer 61) as small as possible when one of the wafers 11 and 11A to 11C is loaded onto the wafer stage 59 in the projection aligner shown in FIG. 14. Accordingly, the cutaway (notch or the like) of a wafer and the other peripheral portion is detected to acquire the X-directional and Y-directional positional dethroughtions and the rotational error of the wafer W, and the wafer and the wafer stage are relatively moved in such a way as to make those measured values nearly 0 (zero) and are chucked by the wafer holder. The wafer prealigrinment mechanism is disclosed in, for example, Japanese Unexamined Patent Publication (KOKAI) No. Hei 7-288276 and its corresponding U.S. patent application Ser. No. 391, 648 (filed: Feb. 21, 1995), and the disclosures in this publication and the U.S. patent application are incorporated herein by reference as a part of the present description within what is permitted by the domestic laws of the country specified or selected in this international application.

Although the projection aligner in FIG. 14 uses the position detecting apparatus in FIG. 1 as an off-axis type alignment sensor, the alignment sensor that is used in this projection aligner may be a TTL (Through The Lens) type which detects a mark on a wafer through the projection optical system PL or a TTR (Through The Reticle) type which detects a mark on a reticle and a mark on a wafer. Although not illustrated in FIG. 14, multiple optical members that constitute the off-axis type alignment sensor 63 are separately held on a plurality of lens barrels which are fixed to hardware provided integrally with a frame on which the projection optical system PL is mounted.

Further, the projection aligner in FIG. 14 is not limited to the step and repeat type, but may be designed as a scanning exposure type such as the step and scan type or a mirror projection type or the step and stitch type which transfer a plurality of patterns on a photosensitive substrate partially overlaying one on another. In addition, it may be designed as a reduction projection type aligner (EUV exposure system) which uses the soft X-ray region (wavelength of about 5 to 15 nm), such as EUV (Extreme Ultra Violet) light with a wavelength of 13.4 nm or 11.5 nm generated from a laser plasma light source or a SOR (Synchrotron Orbital Radiation) ring as the exposure light, a proximity type X-ray exposure system which uses hard X rays, or an exposure system which uses charged particle rays, such as electron rays or an ion beam. Note that in the EUV exposure system, the reduction projection optical system is a reflection system comprising only of a plurality of (about 3 to 6) reflection optical elements and a reflection type reticle is used as a reticle.

Further, as reticles or masks that are used in the exposure system for manufacturing devices, such as semiconductor devices, may be produced by an exposure system which uses, for example, extreme ultraviolet light or vacuum ultraviolet light, this invention can also be adapted to an exposure system which is used in the lithography process for producing reticles or masks.

Furthermore, as the exposure illumination light, g rays and i rays from a mercury lamp, a laser beam, such as a KrF excimer laser beam, ArF excimer laser beam or $F_2$ laser beam, or harmonics from a YAG laser or the like may be used. Alternatively, a harmonic, which is acquired by amplifying a DFB (Distributed feedback) semiconductor laser by a fiber amplifier in which, for example, erbium (Er) (or both erbium and yttrium (Yb)) is doped, and then subjecting it to wavelength conversion to ultraviolet light by using a non-linear optical crystal, may be used as exposure illumination light.

The projection optical system PL in FIG. 14 may be any one of a refraction system, reflection system or reflection/refraction system. Available as the reflection/refraction system is an optical system which has a plurality of refraction systems and two reflection optical elements (at least one of which is a concave mirror) arranged on the optical axis extending straight without being bent, as disclosed in, for example, U.S. Pat. No. 5,788,229. The disclosure in this U.S. patent is incorporated herein by reference as a part of the present description within what is permitted by the domestic laws of the country specified or selected in this international application.

Figure 16:
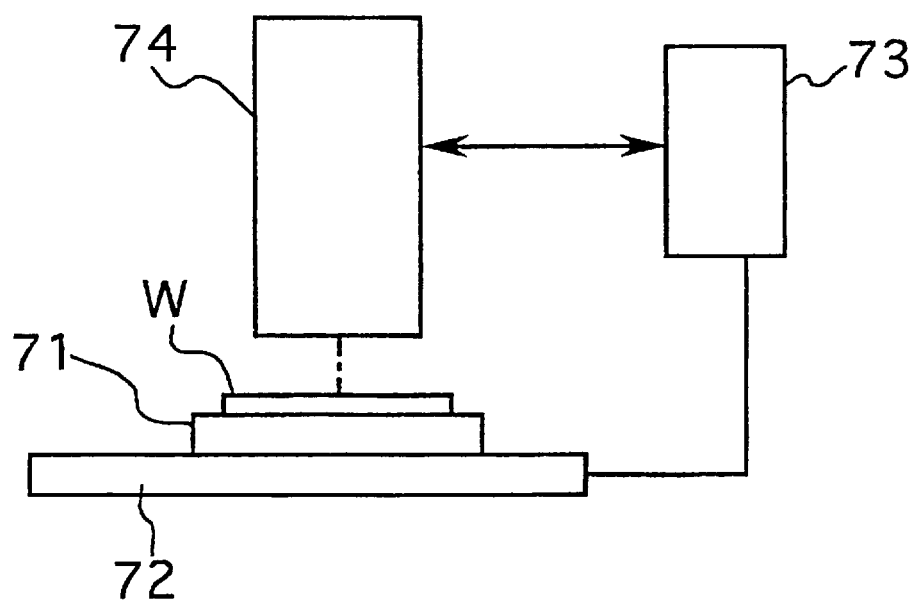
FIG. 16 is a structural diagram showing an overlaying error measuring apparatus equipped with the position detecting apparatus in FIG. 1.

FIG. 16 shows an example in which the position detecting apparatus in FIG. 1 is adapted to an overlaying error measuring apparatus. Because this overlaying error measuring apparatus has only to measure the relative positional relationship among the individual marks in, for example, a pair of lattice marks or a pair of so-called box-in-box marks and need not measure the absolute positions of the individual marks, a high-precision position measuring apparatus such as a laser interferometer is unnecessary. The wafer W on which circuit patterns (or resist patterns) have been formed on two layers to be compared is chucked by a sample table 71 which is so mounted as to be movable on an XY stage 72 in two perpendicular directions, the two-dimensional position of the sample table 71 is measured by an unillustrated linear encoder, and the measured value is supplied to a control operation system 73. The control operation system 73 positions the sample table 71 through the XY stage 72 based on the measured value. The sample table 71 has a function of adjusting the height (focus position) of the wafer W as a to-be-detected subject in a minute range.

A position detecting apparatus 74 having the same structure of the optical system of the position detecting apparatus n FIG. 1 is located above the wafer W, and image signal from the image pickup device 22 of the position detecting apparatus 74 is supplied to the control operation system 73. The control operation system 73 has a function of acquiring the amount of positional dethroughtion of the images of two wafer marks to be detected in addition to the functions of the control operation system 23 in FIG. 1. This overlaying error measuring apparatus, like the above-described embodiments, can adjust the optical system for the illumination system and the detecting optical system with a high accuracy by placing the wafer 11 for adjustment in FIG. 2 or the wafer 11C for adjustment in FIG. 11 on the sample table 71 instead of the wafer W and measuring the distance between the images of each pair of marks. Thereafter, as the wafer W is placed on the sample table 71 and the control operation system 73 drives the XY stage 72 to feed a pair of marks whose relative positions to be measured under the position detecting apparatus 74, an overlaying error can be measured with a high precision.

Because two wafer marks to be detected are formed on different layers in the overlaying error measuring apparatus, the position of the position detecting apparatus 74 in the direction of the optical axis can be different between two marks. At the time of detecting the two wafer marks, therefore, it is desirable that, for example, the sample table 71 should be moved in the direction of the optical axis of the objective lenses 10 or the image pickup device 22 should be moved in the direction of the optical axis of the image-forming optical system in accordance with the distance between the positions of the two wafer marks associated with the direction of the optical axis in such a way that each mark image is accurately focused on the light-receiving surface of the image pickup device 22 in FIG. 1.

Further, the projection aligner in FIG. 14 or the overlaying error measuring apparatus in FIG. 16 is generally provided with an auto focus mechanism which detects the auto focus position of the wafer W (the direction of the optical axis of the alignment sensor 63 or the direction of the optical axis of the position detecting apparatus 74) and focusing the surface of the wafer W on the best focus position of the alignment sensor 63 or the position detecting apparatus 74. In this case, in detecting the position of a wafer mark on the wafer W or the distance between a pair of wafer marks, the measurement need only be taken while this auto focus mechanism is activated to achieve focusing on a to-be-detected mark. Likewise, it is desirable that during the adjustment illustrated in the above-described embodiments, i.e., while measuring the distance between the individual marks on the wafer 11 shown in, for example, FIG. 2, the auto focus mechanism should be activated so that various measurements can be performed in a focused state.

Noted that the auto focus mechanism may be either the TIL type which irradiates a detection beam onto a wafer through the objective lenses 10 or the off-axis illumination type which irradiates a detection beam on the wafer at an inclination to the optical axis of the objective lenses 10 and the surface of the wafer without going through the objective lenses 10. The alignment sensor which has the focus position detecting system of the TTL type is disclosed in, for example, Japanese Unexamined Patent Publication (KOKAI) No. Hei 7-321030 and its corresponding U.S. Pat. No. 5,721,605, and the disclosures in this publication and the U.S. patent are incorporated herein by reference as a part of the present description within what is permitted by the domestic laws of the country specified or selected in this international application. Although the aforementioned detection beam is irradiated on a mark on a wafer in the publication and the U.S. patent, the detection beam may be irradiated on an area on the wafer other than where the mark is formed, e.g., on a street line (scribe line) on the wafer.

In the alignment sensor 63 or the position detecting apparatus 74, illumination light of a wide bandwidth is irradiated on the marks for adjusting the characteristics which are formed on the wafer 11, 11A–11C or the alignment marks on the wafer W and the index marks 14a and 14b are illuminated with the light that is reflected at the wafer. But, an illumination system for the index marks may be provided separately from the illumination system that illuminates marks on the wafer. An alignment sensor which has an illumination system for the index marks is disclosed in, for example, Japanese Unexamined Patent Publication (KOKAI) No. Hei 4-273246 and Japanese Unexamined Patent Publication (KOKAI) No. Hei 5-41343 and their corresponding U.S. patent application Ser. No. 841,833 (filed: Feb. 26, 1992), and the disclosures in the publications and the U.S. patent are incorporated herein by reference as a part of the present description within what is permitted by the domestic laws of the country specified or selected in this international application.

As marks for adjusting the characteristics are formed on the measurement-only wafer 11, 11A–11C in each of the above-described embodiments, the exposure system which is used in the production of the characteristic adjustment marks does not require a modification of the conveying mechanism or wafer holder or the like, and the projection aligner in FIG. 14 and the overlaying error measuring apparatus in FIG. 16 need not be provided with a special conveying mechanism and can load a wafer for measurement onto the XY stage by means of a wafer loader. However, the characteristic adjustment marks may be formed on a plate other than a wafer, and further the plate may be attached to or detached from the sample table 59 or 71 on the XY stage by an operator or the like. If the plate on which the characteristic adjustment marks are to be formed is not a wafer, that plate can be mounted on the XY stage by a wafer loader as long as its shape and size are the same as the substrate (wafer or the like) that is conveyed by the projection aligner in FIG. 14 and the overlaying error measuring apparatus in FIG. 16. As a square substrate is used in an exposure system which is used in producing a liquid crystal display or the like, the plate on which the characteristic adjustment marks are to be formed has a square shape, not a circular shape. Further, a reference plate on which the characteristic adjustment marks are formed may be secured to part of the XY stage and the adjustment may be carried out regularly or in accordance with replacement of the like of the stop in the position detecting apparatus. In this case, the time needed for the measuring operation can be shortened as compared with the case where a measurement-only wafer is used.

Although at least one optical element is moved to adjust the optical characteristics of the illumination system or the image-forming optical system in the position detecting apparatus in FIG. 1, a part (optical element) of the position detecting apparatus may be replaced with another optical element together with the movement of the at least one optical element or the part of the position detecting apparatus alone.

The exposure system (projection aligner) in the above-described embodiments can be manufactured by incorporating the illumination system and the projection optical system, which comprise a plurality of lenses, into the body of the exposure system, performing the optical adjustment, installing the position detecting apparatus shown in FIG. 1 in the hardware provided integrally with the frame on which the projection optical system is held, making connection of wires or the like, performing the optical adjustment as explained in the above-described embodiments, attaching the reticle stage or wafer stage comprising multiple mechanical parts to the body of the exposure system, connecting wires and pipes, and performing general adjustment (electric adjustment, operational check, etc.). It is desirable that the manufacture of the exposure system should be conducted in a clean room in which the temperature, degree of cleanness and so forth are controlled.

In the case where the exposure system of the above-described embodiments is used to manufacture semiconductor devices on a wafer, the semiconductor devices are fabricated through a step of designing the function and performance of the devices, a step of producing reticles based on this design step, a step of producing a wafer from a silicon material, a step of exposing patterns on the reticles on the wafer by performing alignment using the exposure system in FIG. 1, a step of assembling the devices (including a dicing step, bonding step and packaging step), an inspection step and so forth.

This invention can be adapted to the case of executing calibration of not only the alignment sensor in a projection aligner and the overlaying error measuring apparatus but also other inspection measuring devices or the like based on various measuring principles. For example, this invention can be adapted to the case where the electronic optical system or the like of a scanning probe microscope or the like, for example, an atomic force microscope (AFM) or the like.

This invention is not to be limited to the above-described embodiments, but may take various structures without departing from the scope of the invention. All the disclosures in Japanese Patent Application Serial No. 10-27474 filed on Feb. 9, 1998, Japanese Patent Application Serial No. 10-32788 filed on Feb. 16, 1998 and Japanese Patent Application Serial No. 10-85858 filed on Mar. 31, 1998, each including the specification, the scopes of the claims, the drawings and the abstract, are incorporated herein by reference.

Industrial Applicability

The first or second adjusting method for a position detecting apparatus of this invention has the advantage that a plurality of lattice marks for measuring the necessary characteristics can easily and accurately be formed. Therefore, the position detecting apparatus such as an alignment sensor provided in an exposure system which is used at the time of manufacturing devices, such as semiconductor devices, can be adjusted with a high precision by using marks and the overlaying precision or the like is improved. This can ensure mass production of devices, such as high-performance semiconductor devices, with a high yield.

The first adjusting method for a position detecting apparatus has the advantage that asymmetrical aberrations or the like of the detecting optical system can be corrected with a high precision by merely measuring the distance between (the images of) a plurality of lattice marks with different ratios of the width of the recessed portions to the width of the protruding portions. Likewise, the second adjusting method for a position detecting apparatus has the advantage that an adjustment error, such as a positional dethroughtion of the aperture stop of the illumination system, can be corrected with a high precision by merely measuring the distance between (the images of) a plurality of lattice marks whose recessed portions and protruding portions are reversed.

The first or second position detecting apparatus of this invention can use the first or second adjusting method for a position detecting apparatus of this invention.

According to the optical-system adjusting method of this invention, a to-be-detected mark previously rotated by a predetermined angle is formed on an evaluation substrate, so that it is unnecessary to turn the substrate at the time of measuring an error induced by the optical system tool. This leads to the advantage that the error can be measured in a short period of time and there is no reduction in the precision caused by the rotation of the substrate so that the error can be measured with a high precision. It is therefore possible to adjust the tool-induced error quickly and with a high precision.

According to the first or second evaluation substrate, the adjusting method of this invention can be used. Further, the pattern detecting apparatus of this invention can use the optical-system adjusting method of this invention.

As the third adjusting method for a position detecting apparatus uses an evaluation mark which is substantially symmetrical in the measuring direction, the shape of the evaluation mark hardly changes even when the evaluation mark is rotated by 180°. It is therefore possible to measure a tool-induced error (TIS) with a high accuracy without being affected by the distortion or the like of the optical system and thus adjust (correct) the error with a high accuracy.

In the case where as the evaluation mark, a mark whose center portion and two end portions that constitute the evaluation mark are lattice marks which have recessed portions and protruding portions alternately and cyclically laid out in the measuring direction and which have different ratios of the width of the recessed portions to the width of the protruding portions, the evaluation mark can be formed accurately. And, the detecting optical system or the illumination system can be adjusted with a high accuracy.

The third position detecting apparatus of this invention can use that adjusting method.

According to the exposure system method of this invention, the mark detecting system can be adjusted with a high precision by using the adjusting method for a position detecting apparatus of this invention, so that an exposure system having a high overlaying precision can be manufactured.

What is claimed is:

1. An adjusting method for a position detecting apparatus, equipped with a detecting optical system for condensing a flux of light from one to-be-detected mark or a plurality of to-be-detected mark, for detecting a position of said one to-be-detected mark or relative positions of said plurality of to-be-detected marks based on said flux of light condensed by said detecting optical system, including steps of:

(a) preparing a plurality of grating marks which are formed on a predetermined substrate in a vicinity of one another as said to-be-detected marks, said grating marks each having recesses and projections alternately and periodically provided in a predetermined measuring direction and having different ratios of a width of said recesses to a width of said projections;

(b) irradiating an illumination light on said plurality of grating marks;

(c) forming an image of said plurality of grating marks onto a predetermined surface by condensing a reflection light flux from said grating marks illuminated by said illumination light through said detecting optical system;

(d) measuring a distance between said plurality of grating marks in said measuring direction based on said image of said plurality of grating marks formed on said predetermined surface; and (e) adjusting a predetermined optical characteristic of said detecting optical system based on said measured value.

2. The adjusting method according to claim 1, wherein a ratio of said width of said recesses of one of said plurality of grating marks irradiated by said illumination light to said width of said projections is 1:1.

3. The adjusting method according to claim 1, wherein said detecting optical system is an image-forming optical system for projecting images of said plurality of grating marks onto said predetermined surface, and said optical characteristic to be adjusted is a coma.

4. An adjusting method for a position detecting apparatus, equipped with an illumination system for illuminating one to-be-detecting mark or a plurality of to-be-detected marks and a detecting optical system for condensing a flux of light from said to-be-detected marks, for detecting a position of said one to-be-detected mark or relative positions of said plurality of to-be-detected marks based on said flux of light condensed by said detecting optical system, including steps of:

(a) preparing a plurality of grating marks which are formed on a predetermined substrate in a vicinity of each other as said to-be-detected mark, said grating marks each having recesses and projections alternately and periodically provided in a predetermined measuring direction and having such shapes that said recesses and said projections of one of said grating marks are the inverse of those of the other one of said grating marks;

(b) illuminating said plurality of grating marks by an illumination light irradiated from said illumination system;

(c) forming an image of said plurality of grating marks onto a predetermined surface by condensing a reflection light flux from said plurality of grating marks illuminated by said illumination light through said detecting optical system:

(d) measuring a distance between said plurality of grating marks in said measuring direction based on said image of said plurality of grating marks formed on said predetermined surface; and (e) adjusting a predetermined optical characteristic of said illumination system based on said measured value.

5. The adjusting method according to claim 4, wherein said optical characteristic of said illumination system to be adjusted is a position in a plane perpendicular to an optical axis of an aperture stop in said illumination system.

6. The adjusting method according to claim 4, wherein two second grating marks, which are different from two first grating marks having recesses and projections which are inverses of each other, each having recesses and projections alternately and periodically provided in said measuring direction and having different ratios of a width of said recesses to a width of said projections are formed on said substrate in a vicinity of each other;

said predetermined optical characteristic of said illumination system is adjusted based on said distance between said first grating marks, after said adjusting of said optical characteristic of said illumination system, a distance between said second grating marks in said measuring direction through said detecting optical system is measured based on an image of said second grating marks, and a predetermined optical characteristic of said detecting optical system is measured based on said measured valve.

7. The adjusting method according to claim 1, wherein said plurality of grating marks are formed in series in said measuring direction on said substrate and close to one another; and a step height of said recesses and a step height of said projections substantially lie within a range of 40 to 62 nm.

8. A position detecting apparatus which detects a position of one to-be-detected mark or relative positions of plurality of to-be-detected marks, said marks having recesses and projections and generating a reflection light flux when the marks are illuminated, the position detecting apparatus comprising:

an illumination system which irradiates an illumination light on said to-be-measured marks;

a detecting optical system that condenses a reflection light flux from said one to-be-measured mark or said plurality of to-be-measured marks onto a predetermined surface and forms an image of said to-be-measured marks on said predetermined surface;

a photoelectric detector that outputs a detection signal corresponding to said image of said to-be-measured marks formed on said predetermined surface;

a calculator which is electrically connected to said photoelectric detector, and which calculates a distance between said plurality of marks in a predetermined measuring direction based on said detection signal of said photoelectric detector;

a positioning member, which is connected to said detecting optical system, and which positions at least a part of an optical member in said detecting optical system which affects a predetermined optical characteristics; and a control operation system, which is electrically connected to said positioning member and said calculator, and which drives said positioning member in order to reduce an error in said predetermined optical characteristics based on a calculation result of said calculator.

9. A position detecting apparatus, which detects a position of one to-be-detected mark or relative positions of a plurality of to-be-detected marks, said marks having recesses and projections and generating a reflection light flux when the marks are illuminated, the position detecting apparatus comprising:

an illumination system which irradiates an illumination light on said to-be-detected marks;

a detecting optical system that condenses a reflection light flux from said to-be-detected marks onto a predetermined surface and forms an image of said to-be-detected marks on said predetermined surface;

a photoelectric detector that outputs a detection signal corresponding to said image of said to-be-detected marks formed on said predetermined surface;

a calculator which is electrically connected to said photoelectric detector and which calculates a distance between said plurality of marks in a predetermined measuring direction based on said detection signal of said photoelectric detector;

a positioning member, which is connected to said illumination system, and which positions at least apart of an optical member in said illumination system which affects a predetermined optical characteristic; and a control operation system, which is electrically connected to said positioning member and said calculator, and which drives said positioning member in order to reduce an error in said predetermined optical characteristics based on a calculation result of said calculator.

10. An optical-system adjusting method for adjusting a predetermined optical characteristic of at least one of an illumination system fro irradiating illumination light onto to-be-detected subject and a detecting optical system for condensing a flux of light from said to-be-detected subject and a detecting optical system for condensing a flux of light from said to-be-detected subject,including steps of:

(a) forming first and second to-be-detected marks in a predetermined positional relationship and preparing an evaluation substrate on which a third and fourth to-be-detected marks which are the same as said two to-be-detected marks rotated by a predetermined angle while maintaining said positional relationship are formed, said to-be-detected marks each have recesses and projections, and a reflection light flux to be illuminated by illumination light irradiated from said illumination system is generated;

(b) irradiating illumination light on said first and second to-be-detected marks;

(c) condensing a reflection light flux from said first and second to-be-detected marks illuminated by said illumination light on a predetermined surface through said detecting optical system, and forming an image of said first and second to-be-detected marks on said predetermined surface;

(d) measuring relative positions of said first and second to-be-detected marks based on said image of said first and second to-be-detected marks formed on said predetermined surface;

(e) irradiating an illumination light on said third and fourth to-be-detected marks;

(f) forming an image of said third and fourth to-be-detected marks on said predetermined surface by condensing a reflection light flux from said third and fourth to-be-detected marks illuminated by said illumination light through said detecting optical system without rotating said substrate;

(g) measuring relative positions of said third and fourth to-be-detected marks based on said image of said third and fourth to-be-detected marks formed on said predetermined surface; and (h) adjusting at least one of said illumination system and said detecting optical system based on measurement results of steps (d) and (g).

11. The optical-system adjusting method according to claim 10, wherein adjusting at least one of said illumination system or said detecting optical system in such a way that a distance measured for said first and second to-be-detected marks becomes equal to a distance measured for said third and fourth to-be-detected marks.

12. The optical-system adjusting method according to claim 10, wherein said first and second to-be-detected marks are a pair of box-in-box marks.

13. The optical-system adjusting method according to claim 10, wherein said first and second to-be-detected marks are a pair of grating marks each having recesses and projections alternately and periodically provided in predetermined direction and having a form such that said recesses and said projections are the inverse of one another.

14. The optical-system adjusting method according to claim 10, wherein said third and fourth to-be-detected marks which are the same as said first and second to-be-detected marks but rotated by 180°.

15. A position detecting apparatus comprising:

a holding member for holding a subject to-be-detected which comprises a plurality of marks having recesses and projections and generating a refection light flux when the marks are illuminated, said plurality of marks including a pair of first marks arranged along a first direction and a pair of second marks arranged along a second direction which crosses said first direction and having the same structure as said pair of first marks;

an illumination system which irradiates an illumination light on said to-be-detected subject through an objective optical system;

a detecting system which receives a reflection light flux generated from said marks and transmitted though said objective optical system by means of illuminating said to-be-measured subject, and forms an image of said reflection light flux on a predetermined surface;

a calculator for calculating relative positional information of said pair of first marks and relative positional information of said pair of second marks based on an image of said marks formed on said predetermined surface by said detecting system; and an adjusting mechanism, which is electrically connected to said calculator, and which adjusts at least a part of said illumination system, said objective optical system and said detecting system based on a calculation result of said calculator.

16. An adjusting method for a position detecting apparatus, equipped with an illumination system for illuminating one to-be-detected mark or a plurality of to-be-detected marks and a detecting optical system for condensing a flux of light from said to-be-detected marks, for detecting a position of said one to-be-detected mark or relative positions of said plurality of to-be detected marks based on said flux of light condensed by said detecting optical system, including steps of:

(a) placing a substrate formed with an evaluation mark having a center portion comprised of a recess and projection pattern and two end portions each having a recess and projection pattern arranged symmetrically in such a way as to sandwich said center portion in a predetermined measuring direction in a to-be-detected area of said detected optical system;

(b) illuminating said evaluation mark by illumination light irradiated from said illumination system;

(c) forming an image of said evaluation mark on said predetermined surface by condensing reflection light flux from said evaluation mark illuminated by said illumination light on a predetermined surface through said detecting optical system;

(d) detecting a relative positional relationship of said center portion and said two end portions in said measuring direction based on said image of said evaluation mark formed on said predetermined surface; and (e) adjusting a predetermined optical characteristic optical characteristic of said illumination system or said detecting optical system based on said detection result.

17. The adjusting method according to claim 16, wherein at least one of said center portion and said two end portions, which constitute said evaluation mark to be irradiated by said illumination light, is comprised of a grating mark whose ratio of a width of recesses to a width of projections is 1:1.

18. The adjusting method according to claim 16, wherein said center portion and said two end portions, which constitute said evaluation mark to be irradiated by said illumination light, are grating marks each having recesses and projections alternately and periodically provided in said measuring direction and having different rations of a width of said recesses to a width of said projections.

19. The adjusting method according to claim 16, wherein said center portion and said two end portions, which constitute said evaluation mark to be irradiated by said illumination light, are grating marks each having recesses and projections alternately and periodically provided in said measuring direction and said recesses and said projections are the inverse of one another.

20. The adjusting method according to claim 16, wherein after a relative positional relationship between said center portion and said two end portions of said evaluation mark with resect to said measuring direction is detected as a first positional relationship through said detecting optical system,
with said substrate rotated by substantially 180°, detecting a relative positional relationship between said center portion and said two end portions of said evaluation mark with resect to said measuring direction as a second positional relationship through said detecting optical system; and
adjusting a predetermined optical characteristic of said illumination system or said detecting optical system based on said first and second positional relationships.

21. A position detecting apparatus which detects a position of one to-be-detected mark or relative positions of a plurality or to-be-detected marks having recesses and projections and generating a reflection light flux when illuminated, said position detecting apparatus comprising:
an illumination system which irradiates and illumination light on said to-be-detected marks;
a detecting optical system which forms an image of said to-be-detected marks on a predetermined surface by condensing said reflection light flux from said to-be-detected marks on said predetermined surface;
a photoelectric detector which outputs a detection signal according to said image of said to-be-detected mark formed on said predetermined surface;
a calculator which is electrically connected to said photoelectric detector and which calculates a relative positional relationship of at least three locations of a predetermined evaluation mark based on said detection signal from said photoelectric detector;
a positioning member, which is connected to at least a part of an optical member in said illumination system and said detecting optical system which affects a predetermined optical characteristic, and which positions said part of said optical member; and
a control operation system, which is electrically connected to said positioning member and said calculator, and which drives said positioning member in order to reduce an error in said predetermined optical characteristics based on a calculation result of said calculator.

22. An exposure system having a position detecting apparatus as recited in claim 8, a mask stage which holds a mask and a substrate stage which positions a substrate onto which a pattern of said mask is to be transferred and on which an alignment mark for alignment is formed, wherein positional information of said alignment mark on said substrate is detected by said position detecting apparatus and alignment of said mask with said substrate is carried out based on the detection result.

23. The exposure system according to claim 22, wherein said position detecting apparatus can change a detection condition for said alignment mark and at least one optical element is moved or replaced in such a way as to compensate for a variation in an optical characteristic caused by a change in said detection condition.

24. A device manufacturing method for manufacturing a predetermined device by using an adjusting method for a position detecting apparatus as recited in claim 4, the device manufacturing method including steps of:
adjusting a predetermined optical system in said position detecting apparatus by using said adjusting method;
detecting positional information of an alignment mark on a predetermined substrate using said adjusted position detecting apparatus and aligning said substrate with a mask based on the detection result; and
transferring a pattern of said mask onto said substrate.

25. A device manufacturing method for manufacturing a predetermined device by using an adjusting method for a position detecting apparatus as recited in claim 10, the device manufacturing method including steps of:
adjusting a predetermined optical system in said position detecting apparatus by using said adjusting method;
detecting positional information of an alignment mark on a predetermined substrate using said adjusted position detecting apparatus and aligning said substrate with a mask based on the detection result; and
transferring a pattern of said mask onto said substrate.

26. A device manufacturing method for manufacturing a predetermined device by using an adjusting method for a position detecting apparatus as recited in claim 16, the device manufacturing method including steps of:
adjusting a predetermined optical system in said position detecting apparatus by using said adjusting method;
detecting positional information of an alignment mark on a predetermined substrate using said adjusted position detecting apparatus and aligning said substrate with a mask based on the detection result; and
transferring a pattern of said mask onto said substrate.

27. A device manufacturing method for manufacturing a predetermined device by using an adjusting method for a position detecting apparatus as recited in claim 1, the device manufacturing method including steps of:
adjusting a predetermined optical system in said position detecting apparatus by using said adjusting method;
detecting positional information of an alignment mark on a predetermined substrate using said adjusted position detecting apparatus and aligning said substrate with a mask based on the detection result; and
transferring a pattern of said mask onto said substrate.

28. The adjusting method according to claim 1, wherein said to-be-detected mark is positioned in a detection field of view of said detecting optical system at the time of condensing a reflection light flux from said to-be-detected mark on said predetermined surface through said detecting optical system such that the shapes of a to-be-detected mark positioned on one side with respect to a center portion of said detecting field of view and another to-be-determined mark positioned on the other side are different.

29. The adjusting method according to claim 1, wherein an image of said to-be-determined mark formed on said predetermined surface is formed on said predetermined surface by means of condensing a reflection light flux from said to-be-determined mark only once on said predetermined surface through said detecting optical system.

30. The adjusting method according to claim 1, wherein when determining positional information of a predetermine to-be-detected mark having recesses and projections which are provided alternately and periodically, individual positional information of said plurality of recesses or projections constituting said predetermined to-be-detected mark are determined, and said individual positional information of said plurality of recesses or projections are averaged and taken to be positional information of said predetermined to-be-detected mark.

31. The optical-system adjusting method according to claim 11, wherein said first and second to-be-detected marks are a pair of grating marks each having recesses and projections alternately and periodically provided in predetermined direction and having a form such that said recesses and said projections are the inverse of one another.

32. The adjusting method according to claim 4, wherein said to-be-detected mark is positioned in a detection field of view of said detecting optical system at the time of condensing a reflection light flux from said to-be-detected mark on said predetermined surface through said detecting optical system such that the shapes of a to-be-detected mark positioned on one side with respect to a center portion of said detecting field of view and another to-be-determined mark positioned on the other side are different.

33. The adjusting method according to claim 10, wherein said to-be-detected mark is positioned in a detection field of view of said detecting optical system at the time of condensing a reflection light flux from said to-be-detected mark on said predetermined surface through said detecting optical system such that the shapes of a to-be-detected mark positioned on one side with respect to a center portion of said detecting field of view and another to-be-determined mark positioned on the other side are different.

34. The adjusting method according to claim 4, wherein an image of said to-be-determined mark formed on said predetermined surface is formed on said predetermined surface by means of condensing a reflection light flux from said to-be-determined mark only once on said predetermined surface through said detecting optical system.

35. The adjusting method according to claim 10, wherein an image of said to-be-determined mark formed on said predetermined surface is formed on said predetermined surface by means of condensing a reflection light flux from said to-be-determined mark only once on said predetermined surface through said detecting optical system.

36. The adjusting method according to claim 4, wherein when determining positional information of a predetermine to-be-detected mark having recesses and projections which are provided alternately and periodically, individual positional information of said plurality of recesses or projections constituting said predetermined to-be-detected mark are determined, and said individual positional information of said plurality of recesses or projections are averaged and taken to be positional information of said predetermined to-be-detected mark.

* * * * *